US012690447B2

(12) United States Patent
Akhtar et al.

(10) Patent No.: US 12,690,447 B2
(45) Date of Patent: Jul. 21, 2026

(54) COMMON MODE SUPPRESSION CIRCUIT

(71) Applicant: TEXAS INSTRUMENTS INCORPORATED, Dallas, TX (US)

(72) Inventors: Siraj Akhtar, Dallas, TX (US); Vineethraj Rajappan Nair, Freising (BY); Robert Taft, Freising (BY); Swaminathan Sankaran, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 368 days.

(21) Appl. No.: 18/107,600

(22) Filed: Feb. 9, 2023

(65) Prior Publication Data

US 2024/0274530 A1     Aug. 15, 2024

(51) Int. Cl.
| | |
|---|---|
| *H01L 23/528* | (2006.01) |
| *H01L 23/00* | (2006.01) |
| *H01L 23/522* | (2006.01) |

(52) U.S. Cl.
CPC ........ *H01L 23/528* (2013.01); *H01L 23/5226* (2013.01); *H01L 24/08* (2013.01); *H01L 24/16* (2013.01); *H01L 24/48* (2013.01); *H01L 2224/08113* (2013.01); *H01L 2224/16054* (2013.01); *H01L 2224/16055* (2013.01); *H01L 2224/16235* (2013.01); *H01L 2224/16238* (2013.01); *H01L 2224/48225* (2013.01); *H01L 2224/48465* (2013.01); *H01L 2924/15311* (2013.01)

(58) Field of Classification Search
CPC ... H01L 23/528; H01L 23/5226; H01L 24/08; H01L 24/16
See application file for complete search history.

(56) References Cited

U.S. PATENT DOCUMENTS

| | | | | |
|---|---|---|---|---|
| 9,276,056 B2 | * | 3/2016 | Akhtar | H01F 21/12 |
| 9,406,531 B1 | * | 8/2016 | Camacho | H01L 21/485 |
| 9,679,769 B1 | * | 6/2017 | Camacho | H01L 23/49822 |

(Continued)

FOREIGN PATENT DOCUMENTS

| | | | | | |
|---|---|---|---|---|---|
| BR | 102014005808 A2 | * | 3/2015 | ........ | G06F 13/4295 |
| CN | 120358753 A | * | 7/2005 | ............ | H01L 24/32 |

(Continued)

*Primary Examiner* — Laura M Menz

(74) *Attorney, Agent, or Firm* — Zhenhai Fu; Frank D. Cimino

(57) ABSTRACT

An integrated circuit includes a semiconductor die, a package substrate having opposite first and second surfaces, where the first surface includes a first metal pad, the second surface includes a second metal pad and a third metal pad. The semiconductor die is mounted on the second metal pad and the third metal pad by respective first and second metal interconnects. The package substrate includes a circuit with a single-ended terminal and a pair of differential terminals, where the single-ended terminal coupled to the first metal pad. The backage substrate also includes a metal layer including a first meandered conductor and a second meandered conductor. The first meandered conductor is coupled between a first terminal of the pair of differential terminals and the second metal pad. The second meandered conductor is coupled between a second terminal of the pair of differential terminals and the third metal pad.

17 Claims, 16 Drawing Sheets

(56)  References Cited

U.S. PATENT DOCUMENTS

| | | | | |
|---|---|---|---|---|
| 9,735,753 B2 * | 8/2017 | Akhtar | H01F 27/29 |
| 10,181,834 B2 * | 1/2019 | Akhtar | H01L 23/5227 |
| 10,461,717 B2 * | 10/2019 | Akhtar | H01F 27/29 |
| 11,374,118 B2 * | 6/2022 | Or-Bach | H10B 10/125 |
| 11,716,117 B2 * | 8/2023 | Lueders | H04B 5/24 |
| | | | | 174/260 |
| 2012/0056297 A1 * | 3/2012 | Akhtar | H01L 23/5227 |
| | | | | 257/E21.022 |
| 2016/0142036 A1 * | 5/2016 | Akhtar | H01L 23/66 |
| | | | | 29/605 |
| 2017/0338791 A1 * | 11/2017 | Akhtar | H10D 1/20 |
| 2019/0149120 A1 * | 5/2019 | Akhtar | H01F 27/29 |
| | | | | 29/605 |
| 2020/0350310 A1 * | 11/2020 | Or-Bach | H10D 10/40 |
| 2021/0257320 A1 * | 8/2021 | Radulescu | H10D 30/015 |
| 2021/0258045 A1 * | 8/2021 | Lueders | H05K 1/162 |
| 2023/0344467 A1 * | 10/2023 | Lueders | H01F 27/2804 |

| | | | | |
|---|---|---|---|---|
| 2024/0120964 A1 * | 4/2024 | Calabrese | H04B 5/75 |
| 2024/0274530 A1 * | 8/2024 | Akhtar | H01L 23/528 |
| 2024/0395736 A1 * | 11/2024 | Horan | H02M 3/33523 |
| 2025/0218647 A1 * | 7/2025 | Calabrese | H10D 1/20 |
| 2025/0279355 A1 * | 9/2025 | Bertoni | H02M 3/003 |
| 2025/0300149 A1 * | 9/2025 | Tang | H01L 25/0657 |

FOREIGN PATENT DOCUMENTS

| | | | | | |
|---|---|---|---|---|---|
| CN | 101290932 A | * | 10/2008 | H03H 23/367 |
| CN | 113013137 A | * | 6/2021 | H01L 23/5226 |
| CN | 120127363 A | * | 6/2025 | G01S 7/02 |
| CN | 120164880 A | * | 6/2025 | H01L 23/367 |
| DE | 102024135860 A1 | * | 6/2025 | H01F 27/40 |
| EP | 4568008 A1 | * | 6/2025 | G01S 7/02 |
| JP | 2007189396 A | * | 7/2007 | |
| TW | 202512233 A | * | 3/2025 | H02M 3/33523 |
| WO | WO-0065740 A1 | * | 11/2000 | H01L 24/49 |
| WO | WO-2009055684 A1 | * | 4/2009 | H01R 24/20 |
| WO | WO-2025184142 A1 | * | 9/2025 | H01L 23/49822 |

* cited by examiner

COMMON MODE SUPPRESSION CIRCUIT

BACKGROUND

Some circuits convert single-ended signals to a pair of differential signals or vice-versa, such as a balun. Differential signals can have the same amplitude and a phase difference of 180 degrees between them. Differential signals can be helpful for common mode rejection and improving noise immunity. Such circuits can introduce amplitude and/or phase imbalance between the differential signals, and the amplitude/phase imbalance can become common mode signals. The common signals can affect the performance of other circuits that receive the pair of differential signals.

SUMMARY

An integrated circuit includes a semiconductor die, a package substrate having opposite first and second surfaces, where the first surface includes a first metal pad, the second surface includes a second metal pad and a third metal pad. The semiconductor die is mounted on the second metal pad and the third metal pad by respective first and second metal interconnects. The package substrate includes a circuit with a single-ended terminal and a pair of differential terminals, where the single-ended terminal coupled to the first metal pad. The backage substrate also includes a metal layer including a first meandered conductor and a second meandered conductor. The first meandered conductor is coupled between a first terminal of the pair of differential terminals and the second metal pad. The second meandered conductor is coupled between a second terminal of the pair of differential terminals and the third metal pad.

An integrated circuit includes a semiconductor substrate and one or more layers on the semiconductor substrate. The one or more layers include a circuit with a single ended terminal and a pair of differential terminals. The one or more layers also include a metal layer including a first meandered conductor and a second meandered conductor, in which the first meandered conductor is coupled between a first terminal of the pair of differential terminals and a first metal pad. The second meandered conductor is coupled between a second terminal of the pair of differential terminals and a second metal pad.

An integrated circuit includes a substrate with a circuit that has a single ended terminal and a pair of differential terminals. The substrate includes a metal layer with a first meandered conductor and a second meandered conductor. The first meandered conductor is coupled between a first terminal of the pair of differential terminals and a first metal pad. The second meandered conductor is coupled between a second terminal of the pair of differential terminals and a second metal pad.

BRIEF DESCRIPTION OF THE DRAWINGS

The same reference numbers or other reference designators are used in the drawings to designate the same or similar (either by function and/or structure) features.

DETAILED DESCRIPTION

The present disclosure is described with reference to the attached figures. The figures are not drawn to scale and they are provided merely to illustrate the disclosure. Several aspects of the disclosure are described below with reference to example applications for illustration. Numerous specific details, relationships, and methods are set forth to provide an understanding of the disclosure. Furthermore, not all illustrations, components, features, or arrangements are required to implement a methodology in accordance with the selected present disclosure.

Figure 1:
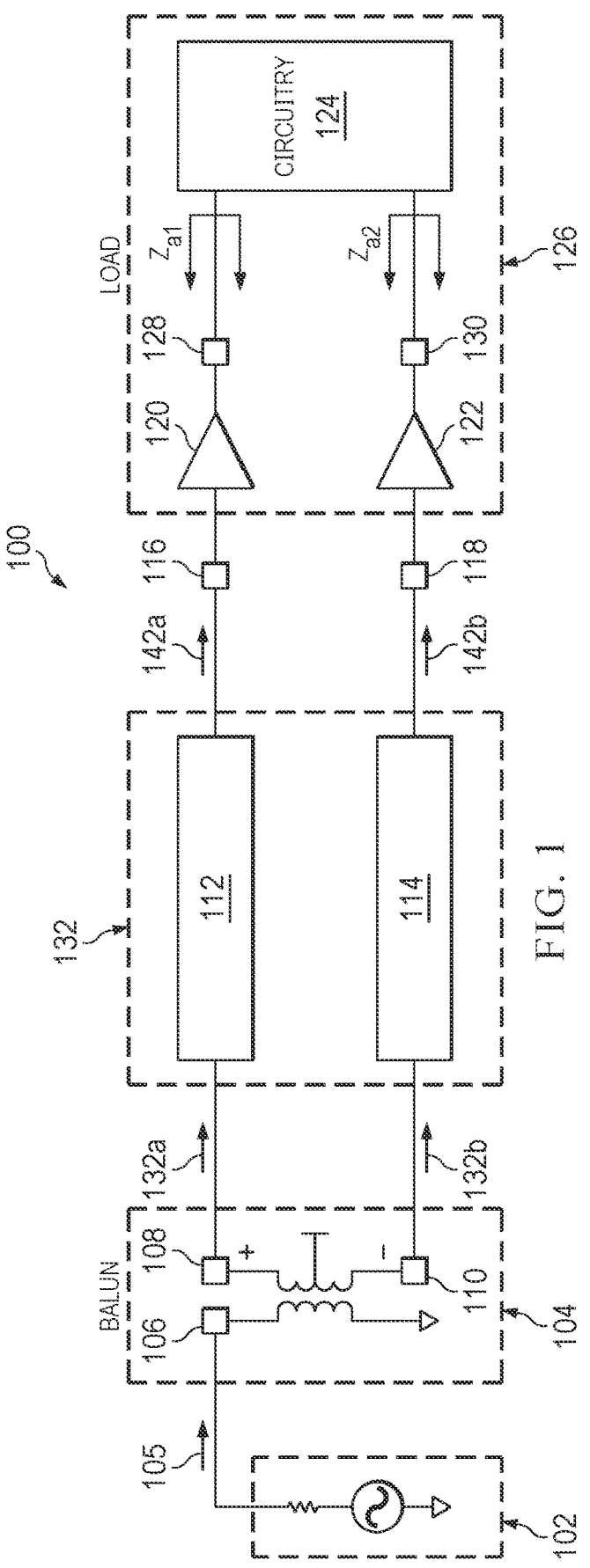
FIG. 1 is a schematic of an example system that can include a balun, a common mode (CM) suppression circuit, and a load.

FIG. 1 is a schematic of a system 100, according to some examples. System 100 can include a signal source 102, a balun 104, a load 126, and a CM suppression circuit 132 coupled between balun 104 and load 126. Examples of the signal source 102 can include a sensor or an antenna (not shown in FIG. 1) to generate a signal 105. In some examples, signal source 102 can provide a single-ended alternating current (AC) signal 105 having one or more frequencies. Balun 104 can include a single-ended terminal 106, and differential terminals 108, 110. Differential terminals 108, 110 and single-ended terminal 106 can be bi-directional terminals, and can receive an input signal or transmit an output signal. Single-ended terminal 106 can be coupled to signal source 102 to receive signal 105.

Balun 104 can generate signals 132a and 132b from signal 105 at differential terminals 108, 110. Balun 104 is configured to generate signals 132a and 132b as differential signals that have equal amplitude (amplitude balance) and 180-degree phase shift (phase balance) with respect to one another. Load 126 can include terminals 116 and 118 to receive signals from balun 104. Load 126 can include various circuits that operate on the input signals (e.g., signals 132a and 132b or signals derived from 132a and 132b). For example, load 126 can perform processing operations on the input signals to generate other signals or a processing result. In some examples, load 126 can include circuitry 124. Circuitry 124 has a pair of differential inputs, and circuitry 124 is configured to process a difference between the input signals at the differential inputs. For example, circuitry 124 can include an analog-to-digital (ADC) converter to perform sampling of the input signals, and perform an analog-to-digital conversion on the sampled input signals to generate a digital representation of the difference between the input signals. Load 126 can also include buffers 120 and 122. Each of buffers 120 and 122 can include a voltage-to-current converter (e.g., a transimpedance amplifier). Buffer 120 can receive a first input signal (e.g., signal 132a or a signal derived from 132a such as signal 142a) at terminal 116 and provide the buffered first input signal at terminal 128 to circuitry 124. Buffer 122 can receive a second input signal (e.g., signal 132b or a signal derived from 132b such as signal 142b) at terminal 118 and provide the buffered second input signal at terminal 130 to circuitry 124. The buffering of the input signals can improve the strength of the input signals, which can facilitate the sampling and analog-to-digital conversion operations by the ADC.

System 100 can include various non-idealities that can degrade the overall performance of system 100. Specifically, due to various reasons, such as tolerance in fabrication, balun 104 may introduce amplitude imbalance and/or phase imbalance in signals 132a and 132b. Because of the amplitude imbalance, there can be amplitude mismatch between signals 132a and 132b. Also, because of the phase imbalance, the phase between the pair of differential signals are more or less than 180-degrees, and can lead to phase imbalance between signals 132a and 132b. Because of the amplitude and/or phase imbalances, a circuit processing a difference between signals 132a and 132b, such as circuitry 124, can detect and process an AC common mode signal, and the AC common mode signal can be present in the processing result provided by circuitry 124. The AC common mode signal may have the same frequency (e.g., the fundamental frequency) as signals 132a and 132b. Also, buffers 120 and 122 may have non-linearity and can generate harmonic signals from the AC common mode signal. Such harmonic signals can introduce unwanted frequency components in the buffered input signals and can be present in the processing result provided by circuitry 124. As to be described below, common mode suppression circuit 132 can suppress some of those harmonic signals by, for example, reducing the amplitude/power of such harmonic signals and/or moving those signals out of a frequency range of interest, to improve the overall performance of system 100.

The following provides an example illustration of the effects of amplitude/phase imbalance and non-linearity. Specifically, a non-linear transfer function of a buffer (e.g., buffers 120, 122) can be as follows:

$$V_{out} = \left[ a V_{in} + b V_{in}^2 + c V_{in}^3 \right] \times Z_L \qquad \text{(Equation 1)}$$

In Equation 1, $V_{out}$ represents the output voltage of the buffer, $V_{in}$ represents the input voltage of the buffer, and a, b, and c are various voltage-current conversion factors of the buffer. Conversion factor a represents the conversion/gain property of the buffer as a linear circuit, whereas conversion factors b and c represent the conversion/gain properties of the buffer as a non-linear, and the sum of the bracket can represent a current. Also, $Z_L$ is the impedance at the input of the buffer.

With $V_{in}$ being an AC signal having a fundamental frequency f, $V_{in}$ can be presented by Acos(wt) where A represents the amplitude, w represents the frequency ($2\pi f$) and t represents time, and the $V_{in}^2$ term from Equation 1 becomes:

$$V_{in}^2 = A^2 \cos^2(\omega t) = \frac{A^2}{2}(1 + \cos(2\omega t)) \qquad \text{(Equation 2)}$$

Equation 2 shows that the non-linearity of the buffer introduces the squared $V_{in}$ term including a second harmonic distortion component (HD2) at double of the fundamental frequency. Similarly, the cubed $V_{in}$ term from Equation 1 includes a third harmonic distortion component (HD3) at three times of the fundamental frequency. These harmonic components add to the $V_{in}$ fundamental frequency component and distort the supposedly linear output signal of the buffer.

Also, the phase and amplitude imbalance introduced in signals 132a and 132b can be represented as follows:

$$V_{plus\_in}(t) = A \cos(\omega t) \qquad \text{(Equation 3)}$$

$$V_{minus\_in}(t) = kA \cos(\omega t + 180° + \varphi) = -kA\cos(\omega t + \varphi) \qquad \text{(Equation 4)}$$

In Equations 3 and 4, $V_{plus\_in}$ (t) can represent signal 132a or signal 142a, and $V_{minus\_in}$ (t) can represent signal 132b or 142b. In the absence of phase and amplitude imbalance, both signals can have the same amplitude A, and $V_{minus\_in}$ (t) can have a 180° phase shift from $V_{plus\_in}$ (t). But with amplitude imbalance, the amplitude of $V_{minus\_in}$ (t) includes an additional factor of k. Also, with phase imbalance, the phase difference between $V_{plus\_in}$ (t) and $V_{minus\_in}$ (t) becomes 180°+φ.

Absent common mode suppression circuit 132, buffers 120 and 122 can receive the respective signals 132a and 132b, and provide the buffered signals at the respective terminals 128 and 130 as follows:

$$V_{out\_plus} = \left[ a A\cos(\omega t) + bA^2 \cos^2(\omega t) + cA^3\cos^3(\omega t) \right] \times Z_{L\_plus} \qquad \text{(Equation 5)}$$

$$V_{out\_minus} = \left[ -a \, kA\cos(\omega t + \varphi) + \right. $$
$$\left. bk^2 A^2\cos^2(\omega t + \varphi) - ck^3 A^3\cos^3(\omega t + \varphi) \right] \times Z_{L\_minus} \qquad \text{(Equation 6)}$$

In Equations 5 and 6, $V_{out\_plus}$ represents the output of buffer 120, and $Z_{L\_plus}$ represents the impedance at the input of buffer 120 (e.g., terminal 116). Also, $V_{out\_minus}$ represents the output of buffer 122, and $Z_{L\_minus}$ represents the impedance of the input of buffer 122 (e.g., terminal 118). Circuitry 124 process a difference between $V_{out\_plus}$ and $V_{out\_minus}$. If the amplitude imbalance and phase imbalance are absent, the second harmonic terms can be cancelled out in the difference. However, due to the presence of the amplitude imbalance and phase imbalance, the second harmonic terms do not cancel out in the difference and can remain as an AC common mode signal as follows:

$$CM = b\frac{A^2}{2}(1 + \cos(2\omega t)) \times Z_{L_{plus}} -$$
$$bk^2\frac{A^2}{2}(1 + \cos(2(\omega t + \varphi)) \times Z_{L\_minus} \qquad \text{(Equation 7)}$$

Equation 7 is based on Equation 2 above. As shown in Equation 7, the greater the k and φ terms, and the greater the impedance at the buffer inputs ($Z_{L\_plus}$ and $Z_{L\_minus}$), the amplitude of the common mode signal (CM) increases. Also, the common mode signal has substantial power at twice of the fundamental frequency of the input signal. Because of the reduced frequency separation between the common signal and the fundamental input signal, it may be difficult to filter out or at least substantially attenuate the common mode signal within a frequency range of interest. Furthermore, in data converters where a sampled clock is used, the harmonics fold into the first Nyquist zone (where the fundamental frequencies reside) and hence cannot be filtered out.

Furthermore, the input impedances $Z_{L\_plus}$ and $Z_{L\_minus}$ of the buffers are complex and frequency dependent, and can have a peak value that further increases the common mode signal. Specifically, the input impedance can include components representing the input resistance of the buffer and the transmission line impedance of the electrical connection between the buffer and the balun as follows:

$$Z_L = \frac{j\omega LR}{R - \omega^2 LRC + j\omega L} \tag{Equation 8}$$

$$Z_L = \frac{-\omega LZ_0 \tan(\beta l) + j[\omega LR + RZ_0 \tan(\beta l) - \omega^2 LRCZ_0 \tan(\beta l)]}{Z_0(R - \omega^2 LRC) - \omega LR \tan(\beta l) + j\omega LZ_0} \tag{Equation 9}$$

In Equations 8 and 9, R represents the input impedance of the buffer, L represents an input inductance of the buffer (which can be parasitic or from an inductive component to introduce peaking), and C represents the input capacitance of the buffer which can include a miller capacitance between the input and output of the buffer. Also, $Z_0$ represents the transmission line characteristic impedance of the electrical connection, l represents the length of the transmission line represented by the electrical connection, $\beta$ represents the wavenumber, and $\omega$ represents the frequency of the signal at the buffer input. Referring to Equations 8 and 9, with $\omega$ at a particular impedance resonant frequency, the denominator of Equations 8 and 9 can be at a minimum, and $Z_L$ can reach a peak value. With $Z_L$ at the peak value (point of resonance), the common mode signal can also have a high amplitude/power, which further exacerbates the distortion introduced to the output signal by the amplitude/phase imbalance of the balun.

Common mode suppression circuit 132 can reduce the distortion introduced to the output signal by the amplitude/phase imbalance of the balun by, for example, reducing the amplitude/power of the second harmonic distortion signals and/or moving the resonance frequency outside of a frequency range of interest, to improve the overall performance of system 100. Specifically, common mode suppression circuit 132 can include conductors 112 and 114 to provide a signal 142a from signal 132a and a signal 142b from signal 132b. In some examples, conductors 112 and 114 can be configured to reduce the peak of input impedances $Z_{L\_plus}$ and $Z_{L\_minus}$ at the impedance resonant frequency, or move the impedance resonant frequency, to reduce $Z_{L\_plus}$ and $Z_{L\_minus}$ at the frequency of interest (e.g., a band of frequency including the input signal fundamental frequency). Also, in some examples, conductors 112 and 114 can be configured to provide asymmetric loading to minimize mismatches between $Z_{L\_plus}$ and $Z_{L\_minus}$ and compensate for the amplitude and/or phase imbalances. All these can reduce the amplitude/power of the common mode signal and the resulting distortion, which can improve the overall performance of system 100.

Figure 2A:
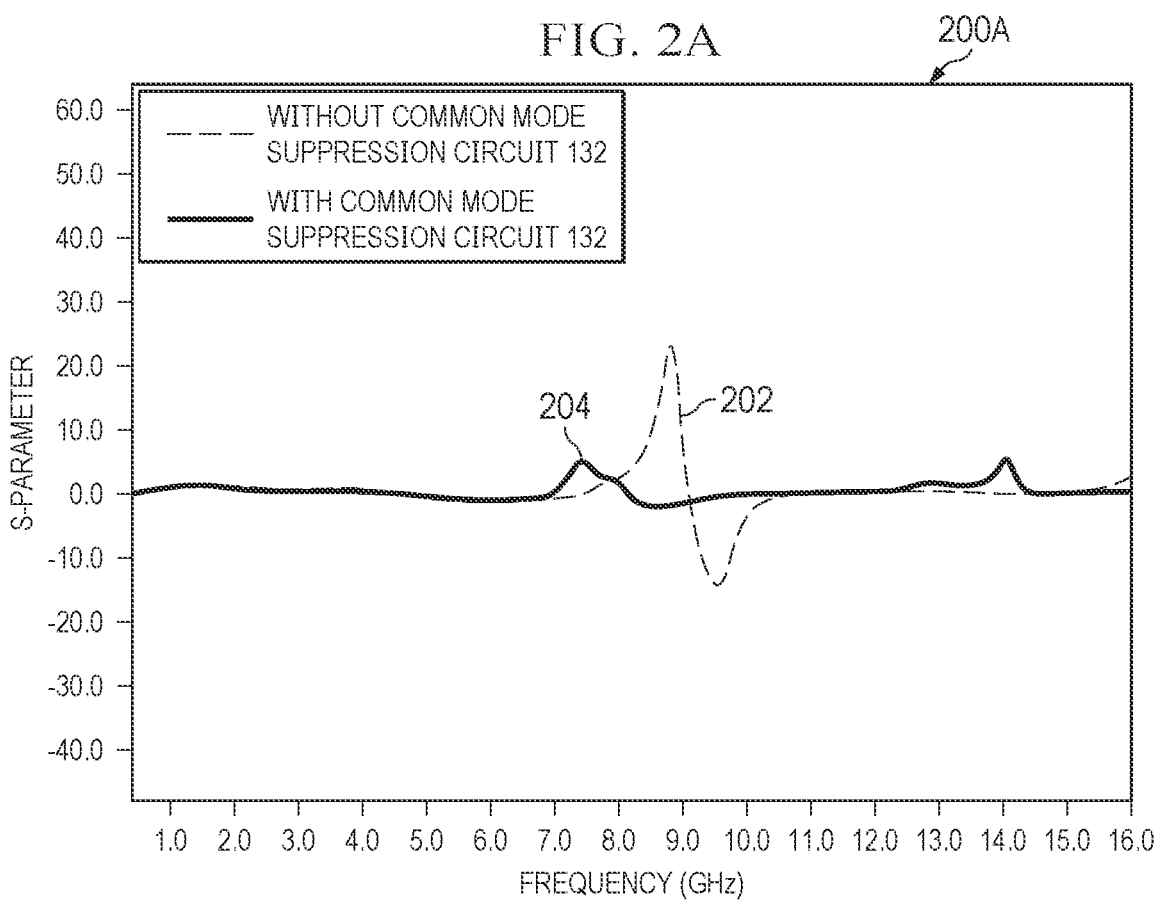
FIGS. 2A and 2B are graphs that illustrates example properties of the system of FIG. 1.
Figure 2B:
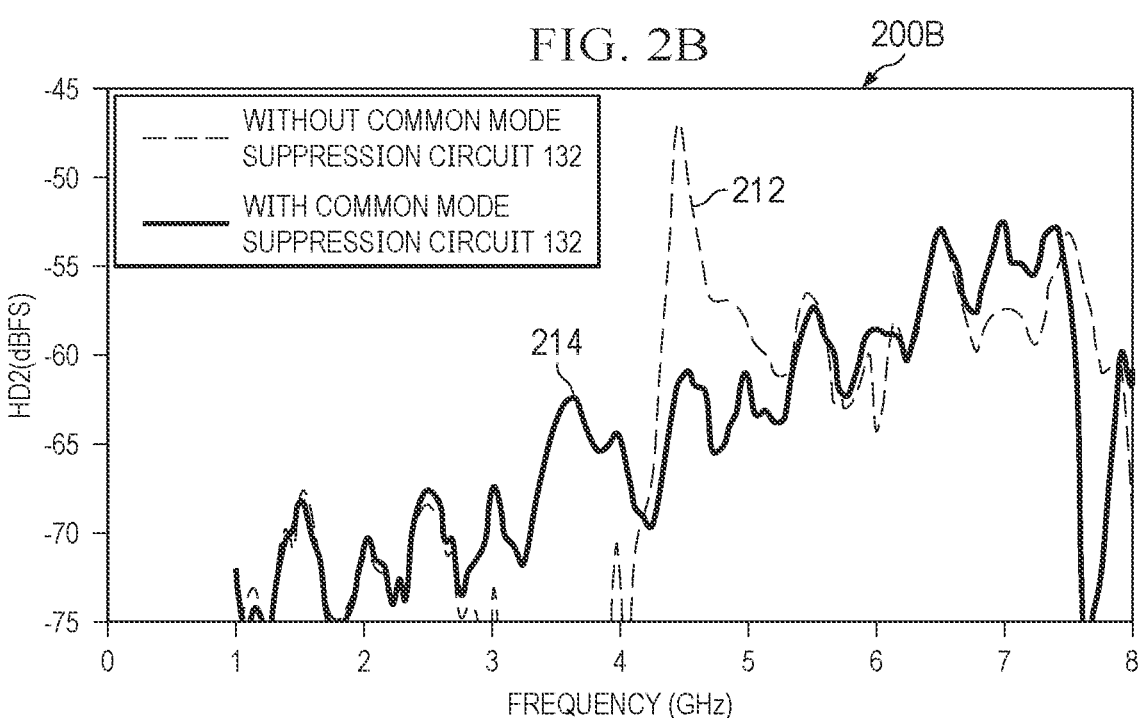

FIG. 2A and FIG. 2B include graphs that illustrate example variations of single-ended buffer input impedance and second harmonic distortion (HD2) as a function of input signal frequency. FIG. 2A includes graphs 202 and 204, and FIG. 2B includes graphs 212 and 214. FIG. 2A illustrates the real component of the complex single-ended buffer impedance (in Ohms), which represents a difference between $Z_{L\_plus}$ and $Z_{L\_minus}$ Graph 202 shows the real component of the complex single-ended buffer impedance without common mode suppression circuit 132, and graph 204 can represent the real component of the complex single-ended buffer impedance with common mode suppression circuit 132, each with respect to an input signal frequency. As shown in graph 202, without common mode suppression circuit 132, the single-ended buffer impedance peaks at 9

GHz and has a peak of 20 Ohms. Also, as shown in graph 204, with common mode suppression circuit 132, the single-ended buffer impedance peaks at 7.5 GHZ and has a reduced peak of 5 Ohms. Accordingly, common mode suppression circuit 132 reduces the peak impedance difference by 75% and moves the resonant frequency of the input impedance away from the 9 GHz.

Also, in FIG. 2B, graphs 212 and 214 represent the HD2 at the single-ended output of the buffers (e.g., difference between $V_{out\_plus}$ and $V_{out\_minus}$). Graph 212 represents the HD2 without common mode suppression circuit 132, and graph 214 represents the HD2 with common mode suppression circuit 132. As shown in graph 212, the single-ended buffer output includes a peak HD2 component at the input frequency of 4.5 GHZ (therefore the HD2 has a frequency of 9 GHZ), which can correspond to the peaking of single-ended buffer impedance at 9 GHz. With common mode suppression circuit 132, the magnitude of the single-ended buffer impedance reduces, and the resonant frequency of the single-ended buffer impedance is shifted from 9 GHZ. Accordingly, comparing between graphs 212 and 214, the HD2 power at 9 GHz is reduced by 25 dB.

Figure 3:
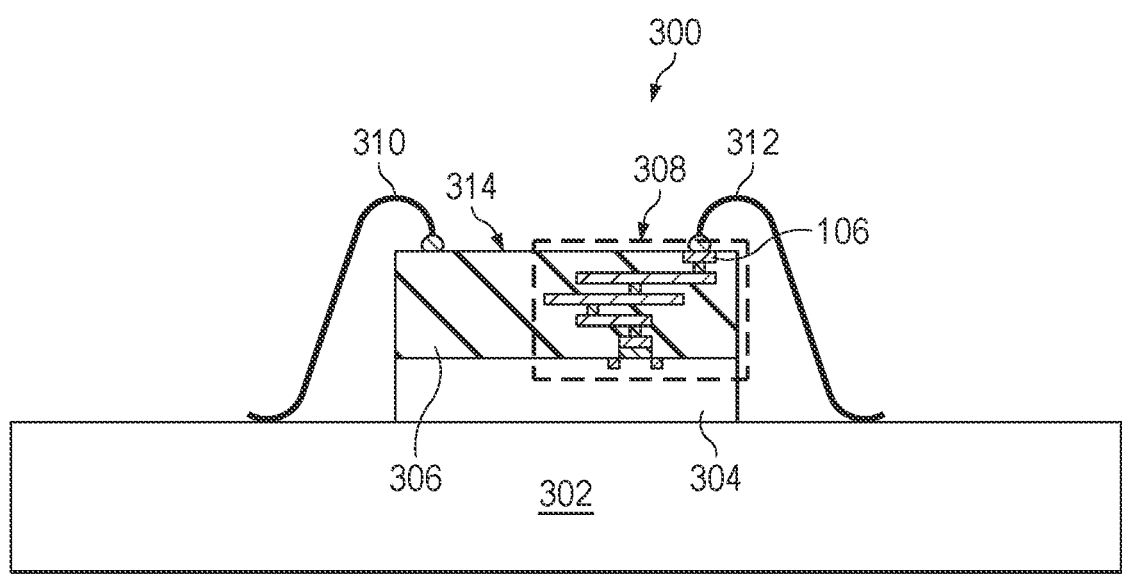
FIGS. 3, 4, and 5 are schematics illustrating example cross-sectional views a semiconductor die, a package substrate, or a printed circuit board including the system of FIG. 1.
Figure 4:
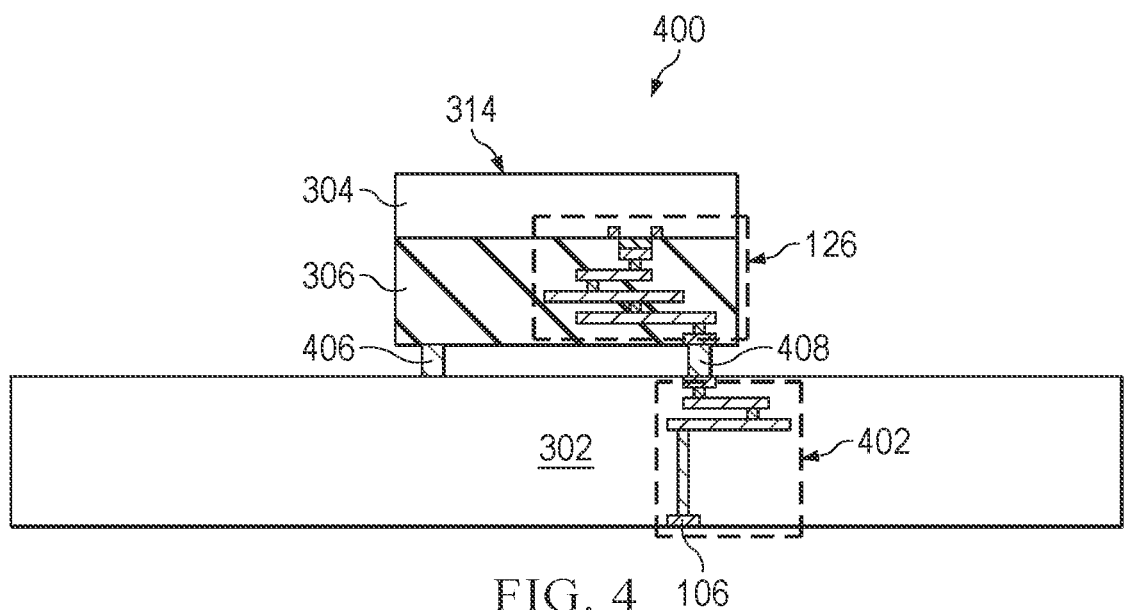
Figure 5:
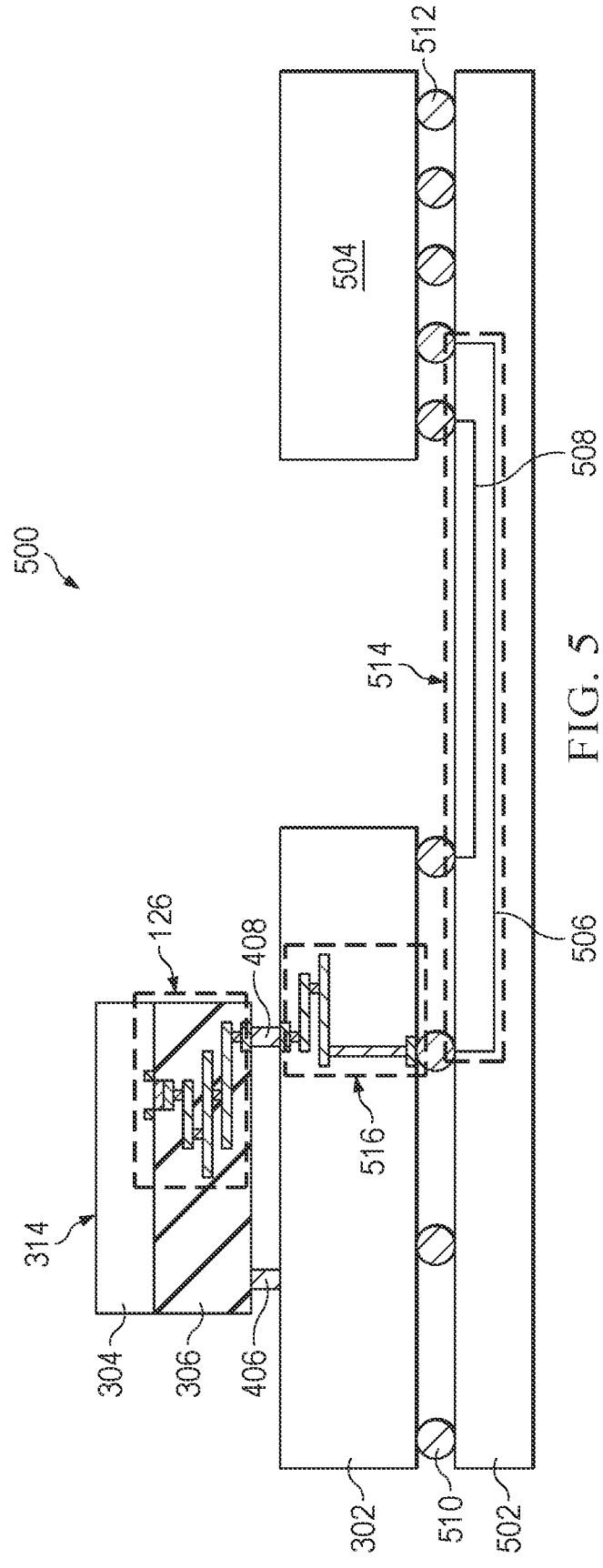

FIGS. 3, 4, and 5 are schematics illustrating example cross-sectional views of a semiconductor die 314, a package substrate 302, or a printed circuit board (PCB) 502 including system 100 and common mode suppression circuit 132 of FIG. 1. FIG. 3 illustrates a cross-sectional view 300 of an example of system 100 from FIG. 1. FIG. 3 shows an example where balun 104, CM suppression circuit 132, and load 126 (of FIG. 1) are within a semiconductor die 314. Cross-sectional view 300 shows a package substrate 302. The semiconductor die 314 with a semiconductor substrate 304 is on the package substrate 302, and an interconnect structure 306 is disposed on the semiconductor substrate 304. The package substrate 302 may be or comprise, for example, one or more of porcelain, mica, glass, plastics, a metal oxide, an epoxy laminate, some other dielectric or combination thereof. The semiconductor substrate 304 may be or comprise, for example, silicon (Si), monocrystalline silicon, germanium (Ge), silicon-germanium (SiGe), gallium arsenide (GaAs), some other semiconductor material, or a combination thereof.

Semiconductor die 314 can electrically couple to package substrate 302 through bond wires 310, 312. Interconnect structure 306 of the semiconductor die 314 can include one or more metal interconnect layers 308 comprising interconnect vias and metal layers that include the balun 104 and the CM suppression circuit 132 of FIG. 1. The single-ended terminal 106 of balun 104 can connect to the package substrate 302 through bond wire 312. As such, balun 104 can connect to a signal source (e.g., signal source 102 of FIG. 1) through the package substrate 302. Devices of load 126 can be implemented on semiconductor substrate 304 interfacing with interconnect structure 306.

FIG. 4 illustrates a cross-sectional view 400 of another example of system 100 from FIG. 1. FIG. 4 shows an example where the balun 104 and CM suppression circuit 132 (of FIG. 1) are disposed within an interconnect structure 402 of the package substrate 302, and load 126 is within the semiconductor die 314. Cross-sectional view 400 shows the semiconductor die 314 electrically coupled to the package substrate 302 by conductive bumps 406, 408.

The semiconductor die 314 includes the interconnect structure 306 over the package substrate 302 and a semiconductor substrate 304 over the interconnect structure 306. The interconnect structure 306 can include a series of interconnect vias and metal layers that define the load 126 of FIG. 1. The load 126 comprised in interconnect structure 306 can couple to the CM suppression circuit 132 (of FIG. 1) through conductive bump 408. The interconnect structure 402 is shown disposed within the package substrate 302 comprising interconnect vias and metal layers. The single-ended terminal 106 of balun 104 can connect to a signal source (e.g., signal source 102 of FIG. 1) through the package substrate 302.

FIG. 5 illustrates a cross-sectional view 500 of another example of system 100 from FIG. 1. FIG. 5 shows an example where the load 126 (of FIG. 1) is disposed within the semiconductor die 314, the balun 104 (of FIG. 1) is disposed within an interconnect structure 514 of a printed circuit board (PCB) 502. The CM suppression circuit 132 is disposed within the interconnect structure 516 of the package substrate 302 or disposed within the interconnect structure 514. The PCB 502 may be or comprise, for example, one or more of porcelain, mica, glass, plastics, a metal oxide, an epoxy laminate, some other dielectric or combination thereof. The interconnect structures 514, 516 can comprise interconnect vias and metal layers. A signal source (e.g., signal source 102 of FIG. 1) can be comprised in device 504. Device 504 is connected to the PCB 502 by conductive bumps 512. The package substrate 302 is connected to the PCB 502 by conductive bumps 510, and the package substrate 302 is electrically coupled to device 504 through one or more wires and conductive layers comprised in interconnect structure 514, including wires 506, 508.

The CM suppression circuit 132 (of FIG. 1) can be disposed in the interconnect structure 516 of package substrate 302. As such the CM suppression circuit 132 connects to the load 126 through conductive bump 408 and can connect to the balun 104 (of FIG. 1) disposed within interconnect structure 514 through conductive bumps 510. Alternatively, the CM suppression circuit 132 and balun 104 are disposed within the interconnect structure 514 of the PCB 502. As such, interconnect structure 516 is a pass through that connects the load 126 to the CM suppression circuit 132 and balun 104 within interconnect structure 514.

Figure 6A:
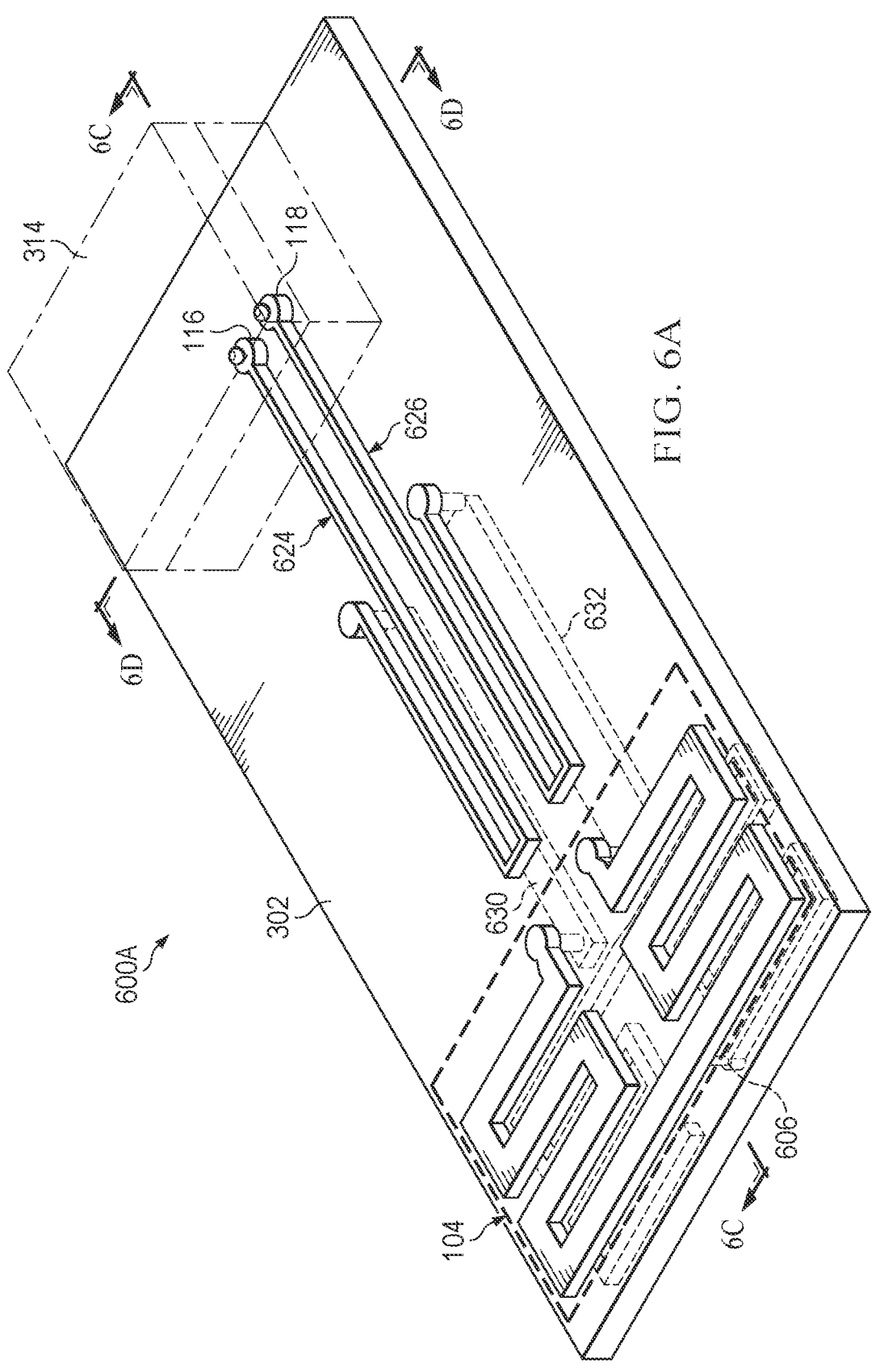
FIGS. 6A, 6B, 6C, and 6D are schematics that illustrate different views of an example of an integrated circuit including the CM suppression circuit of FIG. 1.
Figure 6B:
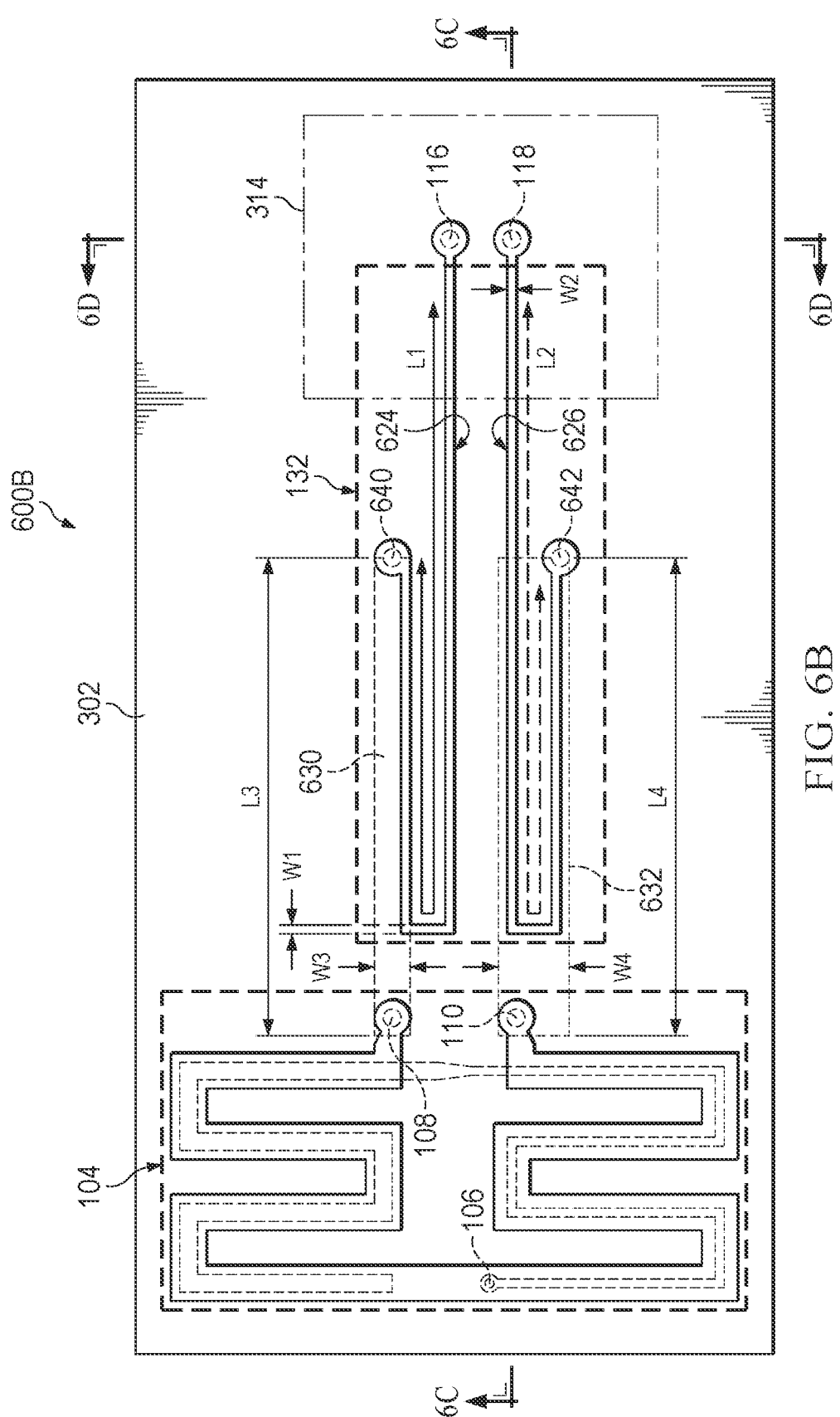
Figures 6C, 6D:
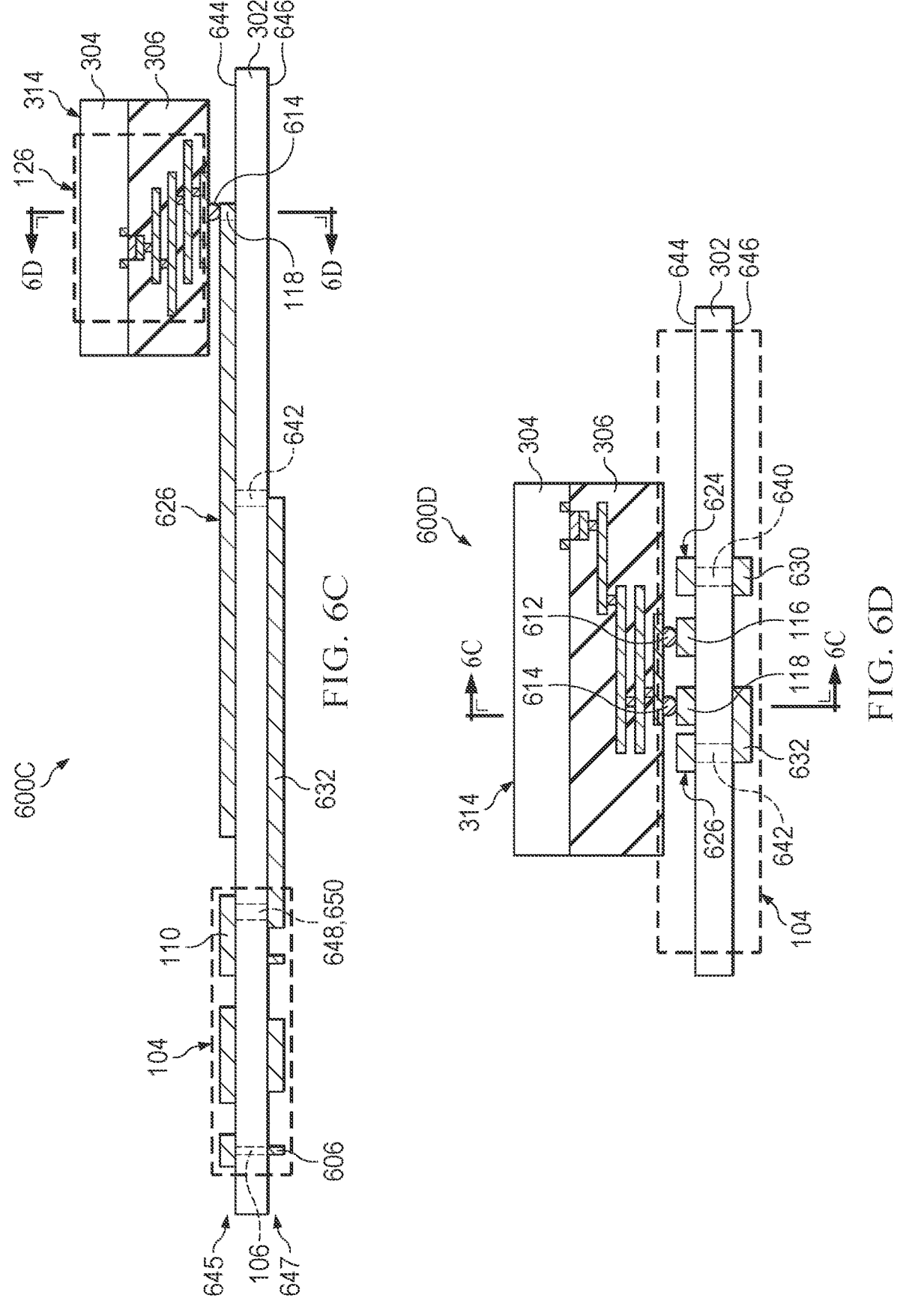

FIGS. 6A, 6B, 6C, and 6D are schematics that illustrate various views of an example common mode suppression circuit 132. FIG. 6A shows a three-dimensional view 600A, FIG. 6B shows a top view 600B, and FIGS. 6C and 6D show cross-sectional views 600C and 600D of the integrated circuit, which are now referred to concurrently. The integrated circuit includes a semiconductor die 314 on a package substrate 302. The CM suppression circuit 132 couples a balun 104 to a load 126. The balun 104 and CM suppression circuit 132 are disposed within the package substrate 302, and the CM suppression circuit 132 extends under the semiconductor die 314 to couple to the load 126. The implementation of the CM suppression circuit 132, balun 104, and load 126 in FIGS. 6A-6D is analogous to the implementation discussed in FIG. 4.

The balun 104 (also referred to as a circuit in some examples), has a single-ended terminal 106 and a pair of differential terminals 108, 110. The balun 104 can include various metal layers and features that converts a signal at the single-ended terminal 106 to a differential signal at the pair of differential terminals 108, 110 as described in accordance with FIG. 1.

The load 126 is disposed within a semiconductor die 314. The semiconductor die 314 includes a semiconductor substrate 304 over an interconnect structure 306. The load 126 can include a series of interconnected layers connected by vias, and metal layers. The load 126 may be, for example, the load 126 as described in FIG. 1 that can include non-linear components that have complex impedances and generate undesired distortion.

The package substrate 302 has opposite first and second surfaces 644, 646.

The first surface 644 includes a first metal layer 645 and the second surface 646 includes a second metal layer 647, where the first metal layer 645 is over the second metal layer 647. The second surface 646 includes a first metal pad 606, and the first surface 644 includes a second metal pad 116 and a third metal pad 118. The semiconductor die 314 is mounted on the second metal pad 116 and the third metal pad 118 by respective first and second metal interconnects 612, 614. The single-ended terminal 106 of the balun 104 is coupled to the first metal pad 606. The first and second metal interconnects 612, 614 can be vias or conductive bumps, for example, analogous to conductive bumps 406, 408 of FIGS. 4-5.

The CM suppression circuit 132 disposed within the package substrate includes a first meandered conductor 624 coupled between a first terminal 108 of the pair of differential terminals 108, 110 and the second metal pad 116. Furthermore, the CM suppression circuit 132 includes a second meandered conductor 626 coupled between a second terminal 110 of the pair of differential terminals 108, 110 and the third metal pad 118. The first meandered conductor 624 and the second meandered conductor 626 are in the first metal layer 645. The first and second meandered conductors can have a width of 5 micrometers to 25 micrometers. In some embodiments, the first and second meandered conductors are approximately 15 micrometers.

In some examples (as shown in subsequent figures—e.g., FIG. 15), first meandered conductor 624 can be directly coupled between first terminal 108 and second metal pad 116, and second meandered conductor 626 can be directly coupled between second terminal 110 and third metal pad 118. The first and second meandered conductors can each provide a signal propagation distance, which also represents the transmission line distance, between balun 104 and load 126. In some examples, the meandered conductors can be symmetrical and matched, and each provide a same signal propagation distance between the respective terminals and metal pads. In some examples, the meandered conductors can be asymmetrical.

The meandered conductors can reduce the common signal in various ways. Specifically, the transmission line distance (labelled L1 and L2 in FIG. 15 or labelled L1 and L3 in FIG. 6B which is analogous to conductor 112 of FIG. 1, and L2 and L4 in FIG. 6B which is analogous to conductor 114 of FIG. 1) can be configured to shift the resonant frequency of the single-ended input impedance away from the frequency of interest. For example, referring again to Equation 9, the denominator of the input impedance expression (denom $(Z_L)$) is provided by:

$$denom(Z_L) = Z_0\left(R - \omega^2 LRC\right) - \omega LR \tan(\beta l) + j\omega L Z_0 \qquad \text{(Equation 10)}$$

Referring to Equation 10, the length l can be set based on the wavenumber B, input capacitance C of the buffer, input resistance R of the buffer, and a frequency of interest, etc., such that the resonant frequency (the frequency at which denominator is at a minimum, such as zero) can be shifted away from the frequency of interest (e.g., the input signal fundamental frequency, the input signal second harmonic frequency, etc.).

In addition, the meandered conductors can increase signal loss, which can reduce the peak input impedance and the resulting common signal.

In some examples, common mode suppression circuit 132 can introduce asymmetricity in the signal propagation paths (L1 and L3; and L2 and L4 of FIG. 6B) between first terminal 108 and second metal pad 116 and between second terminal 110 and third metal pad 118. The asymmetricity can be introduced by asymmetry between the first and second meandered conductors 624 and 626 in conjunction with third and fourth conductors 630, 632. In other embodiments, the asymmetricity can be introduced by asymmetry between first and second meandered conductors 624 and 626 alone.

For example, referring again to Equations 7 and 9:

$$CM = b\frac{A^2}{2}(1 + \cos(2\omega t)) \times Z_{L\_plus} - \tag{Equation 7}$$

$$bk^2\frac{A^2}{2}(1 + \cos(2(\omega t + \varphi)) \times Z_{L\_minus}$$

$$Z_L = \frac{-\omega L Z_0 \tan(\beta l) + j[\omega L R + R Z_0 \tan(\beta l) - \omega^2 L R C Z_0 \tan(\beta l)]}{Z_0(R - \omega^2 L R C) - \omega L R \tan(\beta l) + j\omega L Z_0} \tag{Equation 9}$$

The dimensions of first and second meandered conductors 624 and 626 can be configured to introduce a mismatch between $Z_{L\_plus}$ and $Z_{L\_minus}$ at a particular frequency (e.g., at the resonant frequency of $Z_L$, at the input signal fundamental frequency or input signal second harmonic frequency, etc.) to compensate for the amplitude imbalance (k) and phase imbalance ($\varphi$). For example, referring to Equation 7, at the frequency of interest and for particular values of b, k, and $\varphi$, if the b $A^2/2$ (1+ cos(2 wt)) term is larger than the $bk^2A^2/2$ (1+ cos(2(wt+$\varphi$)), the dimensions of first and second meandered conductors 624 and 626 can be configured to make $Z_{L\_plus}$ smaller than $Z_{L\_minus}$, so as to reduce CM. Referring to Equation 9, the signal propagation distances provided by the first and second meandered conductors 624 and 626 can be configured based on the resonant frequency, as well as the input resistance and inductance of the buffer, to achieve a particular $Z_L$ at the particular frequency. Further, the widths of the first and second meandered conductors 624 and 626 (W1 and W2 respectively) can also be configured to introduce mismatches in the input capacitance (C) at terminals 116 and 118, which can also introduce or increase the mismatch between $Z_{L\_plus}$ and $Z_{L\_minus}$.

In some examples, CM suppression circuit 132 can include additional conductors which can (alone or combined with first and second meandered conductors 624 and 626) introduce asymmetricity in the signal propagation paths between first terminal 108 and second metal pad 116 and between second terminal 110 and third metal pad 118 to reduce CM. Specifically, CM suppression circuit 132 further includes a third conductor 630 and a fourth conductor 632 in the second metal layer 647. In some examples, the third and fourth conductors 630, 632 can be straight conductors. In some examples, the third and fourth conductors 630, 632 can also include meandered conductors. In some examples, the third conductor 630 can have a width of 35 micrometers to 65 micrometers or the width can be 35 micrometers to 100 micrometers. In some examples, the fourth conductor 632 can have a width of 70 micrometers to 100 micrometers or the width can be 35 micrometers to 100 micrometers.

The third conductor 630 is coupled between the first terminal 108 and the second metal pad 116, and the fourth conductor 632 is coupled between the second terminal 110 and the third metal pad 118. The pair of differential terminals 108, 110 connect to the third and fourth conductors 630, 632 through a pair of metal interconnects 648, 650 that extend through the package substrate 302. The third conductor 630 couples to the second metal pad 116 through the first meandered conductor 624 by coupling to the first meandered conductor 624 by a first interconnect 640 that extends through the package substrate between the first and second metal layers 645, 647. The fourth conductor 632 couples to the third metal pad 118 through the second meandered conductor 626 by coupling to the second meandered conductor 626 by a second interconnect 642 that extends through the package substrate between the first and second metal layers 645, 647. The third conductor 630 has a length L3 and the fourth conductor 632 has a length L4. In some embodiments, L1 and L2 can be approximately 4 millimeters, and L3 and L4 can be approximately 2 millimeters. As such, the total length of the transmission line comprising the first meandered conductor 624 and the third conductor 630 or the second meandered conductor 626 and the fourth conductor 632 can be approximately 6 millimeters.

In some embodiments, the dimensions of the third and fourth conductors 630, 632 can be configured to introduce mismatch a mismatch between $Z_{L\_plus}$ and $Z_{L\_minus}$ at a particular frequency (e.g., at the resonant frequency of $Z_L$, at the input signal fundamental frequency or input signal second harmonic frequency, etc.) to compensate for the amplitude imbalance (k) and phase imbalance ($\varphi$), as described above. For example, the third conductor 630 can provide a signal propagation distance L3 that adds to the signal propagation distance L1 of the first meandered conductor 624, and the third conductor 630 can provide a signal propagation distance L4 that adds to the signal propagation distance L1 of the second meandered conductor 626. The total distances of L1 and L3 and of L2 and L4 can be configured to, for example, shift the resonant frequency of $Z_{L\_plus}$ and $Z_{L\_minus}$, and/or to increase signal loss to reduce $Z_{L\_plus}$ and $Z_{L\_minus}$.

Also, mismatches can be introduced between the dimensions of the third and fourth conductors 630, 632 to introduce mismatches between $Z_{L\_plus}$ and $Z_{L\_minus}$. For example, referring to FIGS. 6A-6D, the third and fourth conductors 630, 632 can have different widths (W3 and W4). The first meandered conductor 624 overlaps at least a part of the third conductor 630 by a first overlap area and the second meandered conductor 626 overlaps at least a part of the fourth conductor 632 by a second overlap area that is different than the first overlap area, with the difference in the overlap areas due to the width mismatch between the third and fourth conductors 630, 632. The differences in the overlap areas can introduce differences in the capacitance and/or inductance of the transmission lines impedance (Z of Equation 9) defined by the first and second meandered conductors or the third and fourth conductors to minimize distortions of signals received at terminals 116 and 118. Accordingly, the mismatches in the widths of the third and fourth conductors 630, 632, and the mismatches in the overlap areas seen at terminals 116 and 118, can be configured based on, for example, a target mismatch between $Z_{L\_plus}$ and $Z_{L\_minus}$ to compensate for the phase and/or amplitude mismatches at a particular frequency (e.g., at the resonant frequency of $Z_L$, at the input signal fundamental frequency or input signal second harmonic frequency, etc.), as well as the input resistance and inductance of the buffer, to achieve a particular $Z_L$ at the particular frequency.

It is noted that while FIGS. 6A-6D show the balun 104 and CM suppression circuit 132 disposed in the package substrate 302 and the load 126 disposed in the semiconductor die 314, the balun 104, CM suppression circuit 132, and load 126 can be implemented in other configurations.

For example, the balun 104, CM suppression circuit 132, and package substrate 302 can be implemented on the semiconductor die 314 as shown in FIG. 3. As such, the integrated circuit would include a semiconductor die 314 with a semiconductor substrate 304. One or more metal layers (e.g., analogous to metal layers of one or more metal interconnect layers 308 of FIG. 3) are disposed on the semiconductor substrate. The one or more metal layers include the balun 104, CM suppression circuit 132, and load 126. In another example, the CM suppression circuit 132 can be implemented on a PCB as discussed in FIG. 5 (e.g., PCB 502) or a generic substrate. Additionally, the balun 104 and load 126 can be implemented on a PCB or other generic substrate.

Figure 7:
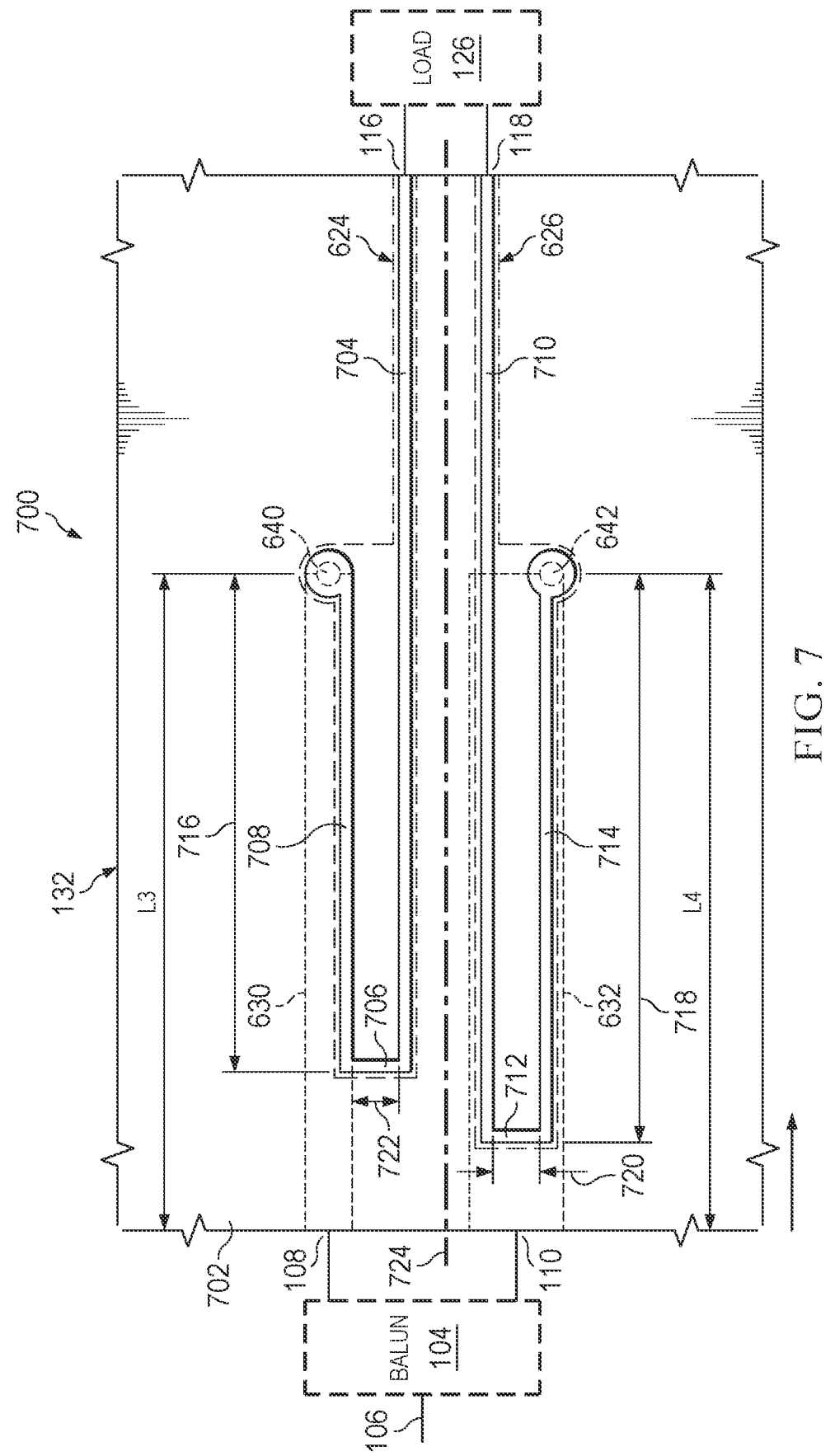
FIGS. 7, 8, 9, 10, 11, 12, 13, 14, and 15 are schematics that illustrate examples of an integrated circuit including the CM suppression circuit of FIG. 1.

FIG. 7 shows a top view 700 of an integrated circuit with a CM suppression circuit 132 that has asymmetric first and second meandered conductors 624, 626. FIG. 7 differs from FIG. 6A-6D with respect to the first meandered conductor 624 and second meandered conductor 626 having different lengths. Furthermore, FIG. 7 is shown in the context of a balun 104 and a load 126 that are generic. That is balun 104 of FIG. 7 can be the balun 104 of FIG. 6A-6D or a generic balun as discussed in accordance with FIG. 1. Likewise the load 126 of FIG. 7 is a generic load as discussed in accordance with FIG. 1. The CM suppression circuit 132 of FIG. 7 is shown with a substrate 702 that is a generic substrate, and can be a semiconductor substrate (e.g., semiconductor substrate 304 of FIG. 3), a package substrate (e.g., package substrate 302 of FIGS. 3-5), or a PCB (e.g., PCB 502 of FIG. 5). Furthermore, the balun 104 and load 126 of FIG. 7 can be implemented on the substrate 702 or on another substrate different than the substrate 702. In some embodiments, the substrate 702 can have a thickness of approximately 100 micrometers to 250 micrometers, or in other embodiments, the substrate 702 is 300 micrometers to 700 micrometers.

FIG. 7 shows a substrate 702 with a first surface over a second surface (e.g., analogous to first surface 644 and second surface 646 of FIG. 6C). The balun 104 has a single-ended terminal 106 and a pair of differential terminals 108, 110 that includes a first terminal 108 and a second terminal 110 on the second surface. The load circuit connects to differential load terminals 116, 118 that includes a third terminal 116 (e.g., analogous to the second metal pad 116 of FIG. 6B) and a fourth terminal 118 (e.g., analogous to the third metal pad 118 of FIG. 6B) on the first surface. The pair of differential terminals 108, 110 are separated from the differential load terminals 116, 118 by a line 724. The pair of differential terminals 108, 110 are aligned with one another in a first plane that is perpendicular to the line 724. Furthermore, the differential load terminals are aligned with one another in a second plane that is perpendicular to the line 724. The CM suppression circuit 132 electrically couples the balun 104 to the load 126 and the CM suppression circuit 132 is connected to the pair of differential terminals 108, 110 and connected to the differential load terminals 116, 118.

The CM suppression circuit 132 includes a first meandered conductor 624 and a second meandered conductor 626 disposed on the first surface of the substrate 702. The CM suppression circuit 132 further includes a third conductor 630 and a fourth conductor 632 disposed on the second surface of the substrate 702. The third conductor 630 overlaps the first meandered conductor 624 by a first overlap amount partially defined by a first overlap distance 716, and couples to the first meandered conductor 624 through a first interconnect 640. The fourth conductor 632 overlaps the second meandered conductor 626 by a second overlap amount partially defined by a second overlap distance 718, and couples to the second meandered conductor 626 through a second interconnect 642. In this example, the first overlap distance 716 and the second overlap distance 718 are different. The first interconnect 640 and the second interconnect 642 are aligned in a third plane that is perpendicular to the line 724, where the third plane is between the first plane and the second plane.

A length of the third conductor 630 is defined by a distance parallel to the line 724 between the first terminal 108 and the first interconnect 640. A length of the fourth conductor 632 is defined by a distance parallel to the line 724 between the second terminal 110 and the second interconnect 642. The length of the third conductor 630 and the length of the fourth conductor are the same. A width of the third conductor 630 and a width of the fourth conductor 632 are defined in a direction perpendicular to the line 724 where the width of the third conductor 630 and the width of the fourth conductor 632 are different. In alternative embodiments (not shown), the width of the third and fourth conductors 630, 632 are the same.

The third conductor 630 and the first meandered conductor 624 are laterally offset from the fourth conductor 632 and the second meandered conductor 626 in a second direction that is perpendicular to the first direction of line 724. Furthermore, the third and fourth conductors 630, 632 and the first and second meandered conductors 624, 626 are asymmetric about the line 724.

The first meandered conductor 624 includes a first segment 704 extending from the third terminal 116 and towards the first terminal 108. The first meandered conductor 624 further includes a second segment 706 extending from the first segment 704 in a direction perpendicular to the line 724 and extending away from the second meandered conductor 626. The first meandered conductor 624 further includes a third segment 708 extending from the second segment 706 parallel to the line 724 and connects to the first interconnect 640. A length of the first segment 704 is greater than a length of the second segment 706 and greater than a length of the third segment 708. The length of the second segment 706 is less than the length of the third segment 708. As such, the first segment 704 is separated from the third segment 708 by a distance 722 defined by the length of the second segment 706.

The second meandered conductor 626 includes a fourth segment 710 extending from the fourth terminal 118 towards the second terminal 110. The second meandered conductor 626 further includes a fifth segment 712 extending from the fourth segment 710 in a direction perpendicular to the line 724 and extending away from the first meandered conductor 624. The second meandered conductor 626 further includes a sixth segment 714 extending from the fifth segment 712 parallel to the line 724 and connects to the second interconnect 642. A length of the fourth segment 710 is greater than a length of the fifth segment 712 and greater than a length of the sixth segment 714. The length of the fifth segment 712 is less than the length of the sixth segment 714. As such, the fourth segment 710 is separated from the sixth segment 714 by a distance 720 defined by the length of the fifth segment 712. In some embodiments, the total length of the first meandered conductor 624 and the third conductor 630 is more than 6 millimeters and the total length of the second meandered conductor 626 and the fourth conductor 632 is 6 millimeters or less.

The first overlap amount is defined by the third conductor 630 overlapping only the third segment 708 of the first meandered conductor 624. The second overlap amount is defined by the fourth conductor 632 overlapping the fourth segment 710, the fifth segment 712, and the sixth segment 714 of the second meandered conductor 626. As such, the fourth conductor 632 is separated from the third conductor 630 by the first meandered conductor 624. Furthermore, the second meandered conductor 626 is separated from the first meandered conductor 624 by the fourth conductor 632.

The second meandered conductor 626 is longer than the first meandered conductor 624 where the first segment 704 and third segment 708 of the first meandered conductor 624 are respectively shorter than the fourth segment 710 and the sixth segment 714 of the second meandered conductor 626. In an alternative embodiment (e.g., FIG. 6B), the length of the first segment 704 and the fourth segment 710 are the same, the length of the second segment 706 and the fifth segment 712 are the same, and the length of the third segment 708 and the sixth segment 714 are the same.

Figure 8:
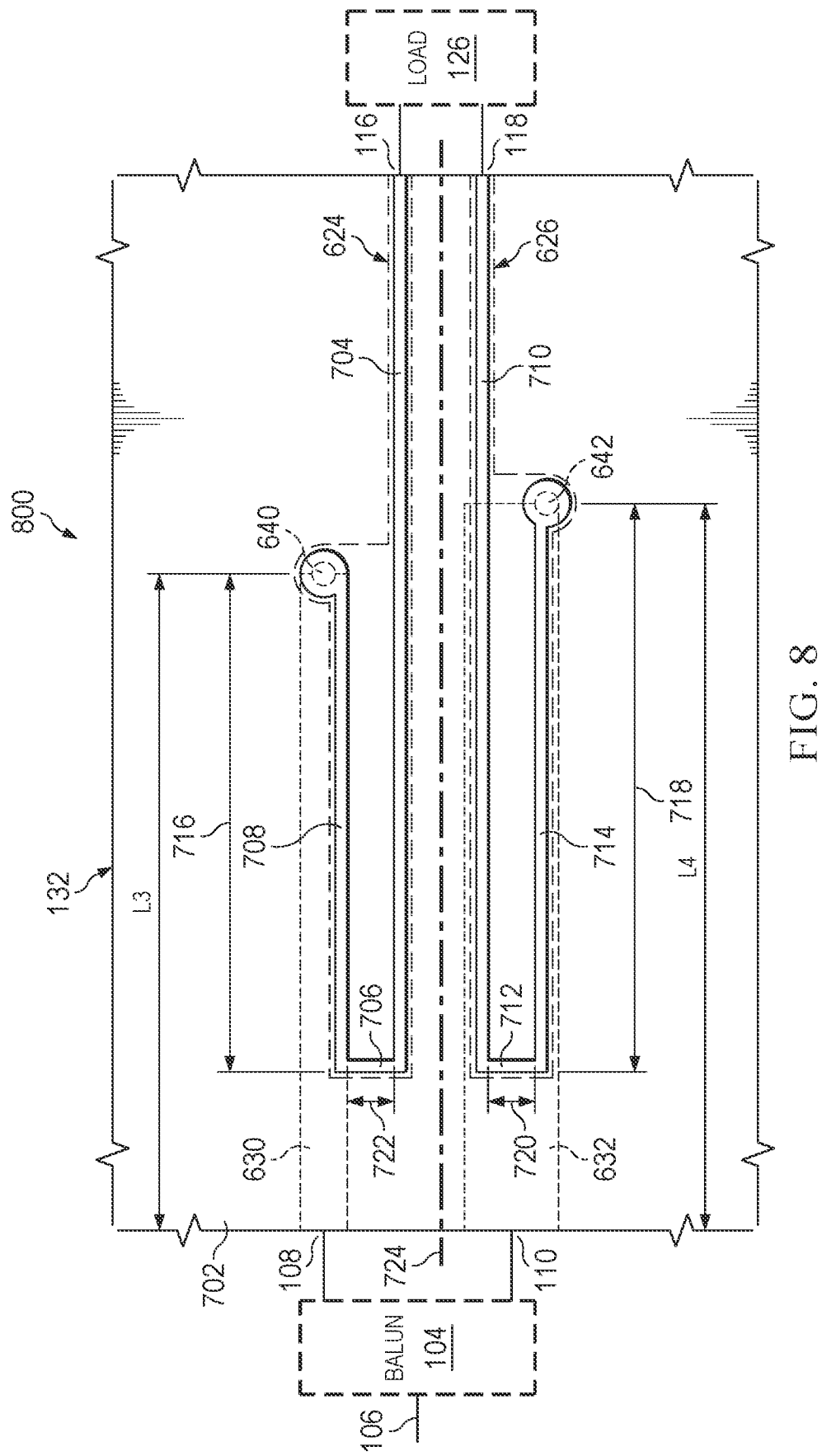

FIG. 8 shows a top view 800 of an integrated circuit with a CM suppression circuit 132 that has third and fourth conductors 630, 632 with different lengths, that is L3 and L4 are different lengths. FIG. 8 differs from FIG. 7 with respect to the first and second meandered conductors 624, 626, the length of third and fourth conductors 630, 632, and placement of the first and second interconnects 640, 642.

In FIG. 8, a length of the third conductor 630 is defined by a distance L3 parallel to the line 724 between the first terminal 108 and the first interconnect 640. A length of the fourth conductor 632 is defined by a distance L4 parallel to the line 724 between the second terminal 110 and the second interconnect 642. The length of the fourth conductor 632 is greater than the length of the third conductor 630. As such, the second interconnect 642 is laterally offset from the first interconnect 640 in the first direction parallel to the line 724. Furthermore, the first overlap distance 716 is less than the second overlap distance 718 where the length of the third segment 708 of the first meandered conductor 624 is less than the length of the sixth segment 714 of the second meandered conductor 626. Additionally, the length of the first segment 704 of the first meandered conductor 624 is the same as the length of the fourth segment 710 of the second meandered conductor 626.

Figure 9:
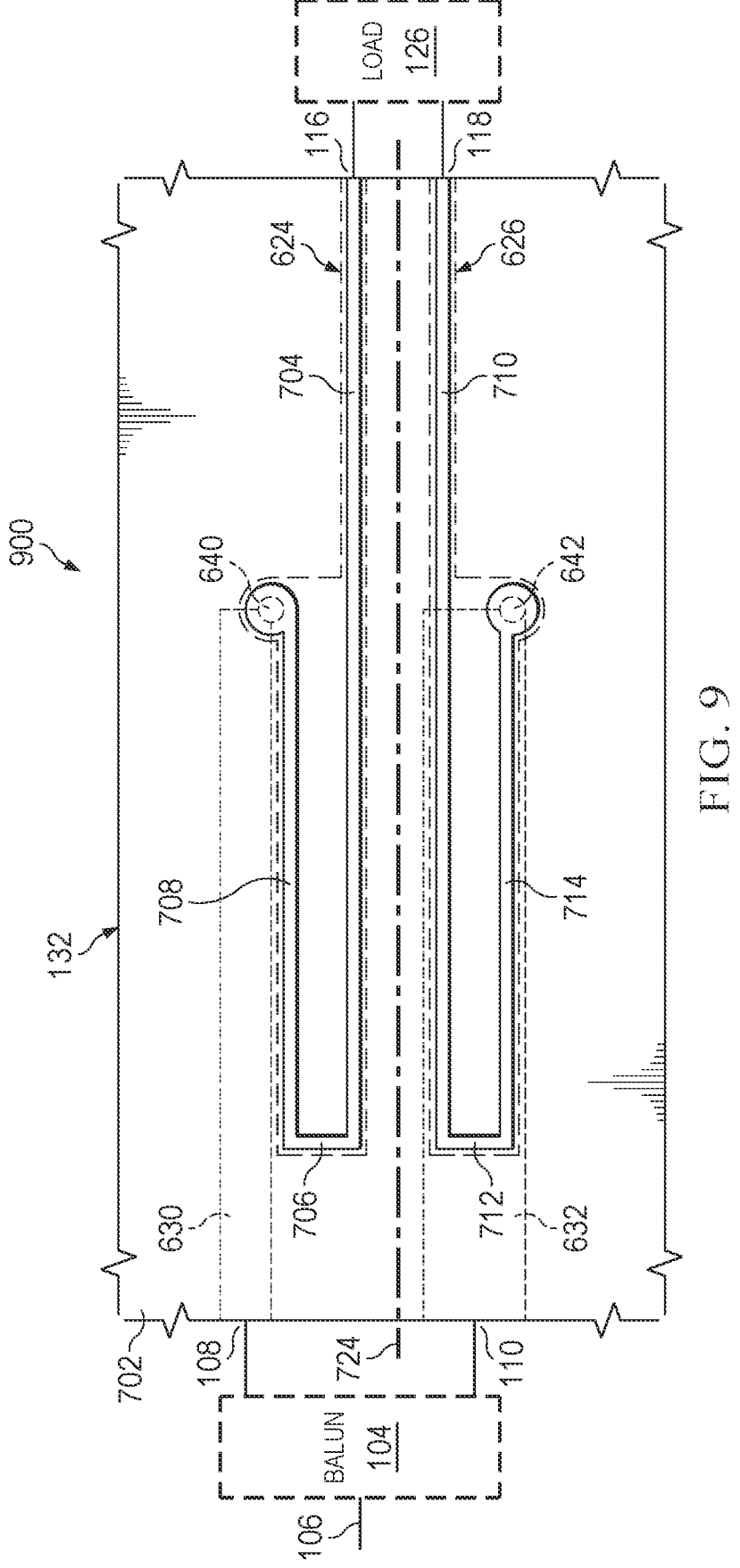

FIG. 9 shows a top view 900 of an integrated circuit with a CM suppression circuit 132 where the first meandered conductor 624 is laterally offset from the third conductor 630. FIG. 9 differs from FIG. 7 with respect to the first and second meandered conductors 624, 626 and the first and second overlap amounts.

In FIG. 9, the first meandered conductor 624 and second meandered conductor 626 have segments that are the same lengths. The first meandered conductor 624 is laterally offset from the third conductor 630 where there is a gap between the first meandered conductor 624 and the third conductor 630 in a direction perpendicular to the line 724. As such, there is no overlap between the third conductor 630 and the first meandered conductor 624. The second meandered conductor 626 is also shifted relative to FIG. 7 where an outer edge of the sixth segment 714 parallel to the line 724 is aligned with an outer edge of the fourth conductor 632.

Figure 10:
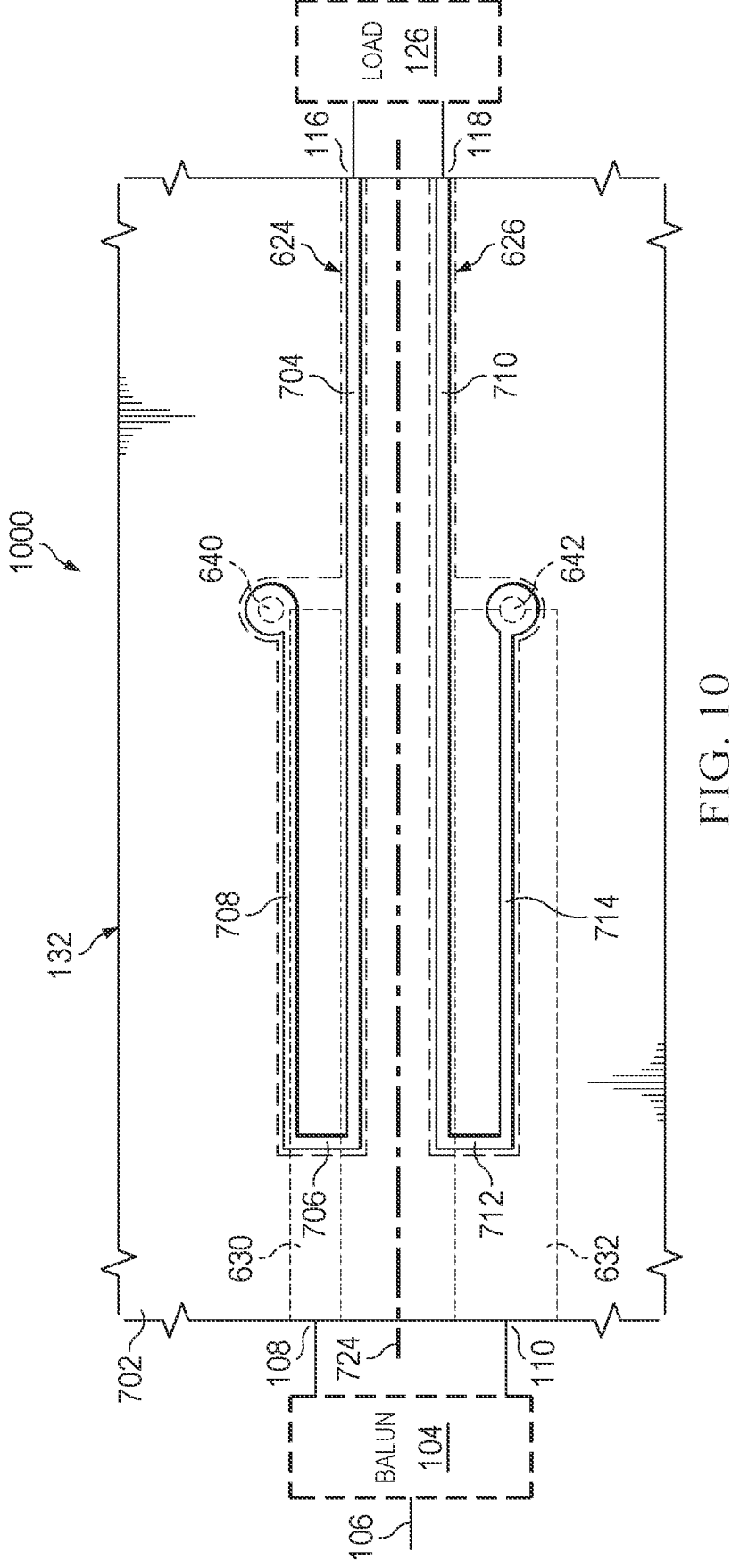

FIG. 10 shows a top view 1000 of an integrated circuit with a CM suppression circuit 132 where the first and second meandered conductors 624, 626 are shifted relative to FIG. 9. FIG. 10 differs from FIG. 9 with respect to the first and second meandered conductors 624, 626 and the first and second overlap amounts. The first meandered conductor 624 extends past outer edges of the third conductor 630 in a direction perpendicular to line 724. The third conductor 630 overlaps portions of the first segment, 704, the second segment 706, and the third segment 708 of the first meandered conductor 624. The second meandered conductor 626 is shifted relative to FIG. 9 such that the fourth conductor 632 does not overlap the fourth segment 710, overlaps a portion of the fifth segment 712 and overlaps the sixth segment 714 of the second meandered conductor 626.

Figure 11:
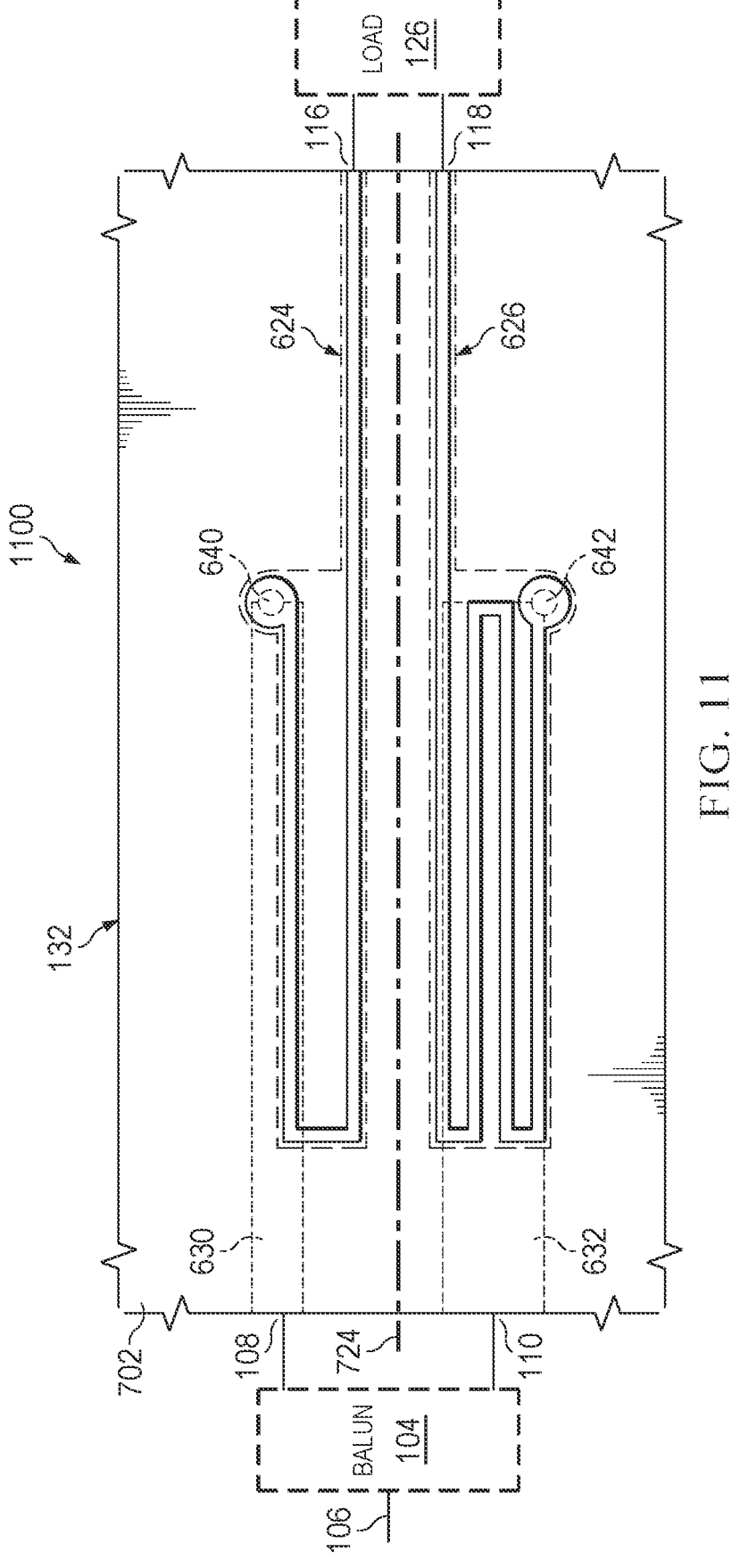

FIG. 11 shows a top view 1100 of an integrated circuit with a CM suppression circuit 132 where the second meandered conductor 626 has multiple meandered segments. FIG. 11 shows an alternative embodiment where the first meandered conductor 624 and the second meandered conductor 626 have a different number of meandered segments. The first meandered conductor 624 has a single meandered bend forming a "U" shape. The second meandered conductor 626 has three meandered bends forming a "W" shape.

Figure 12:
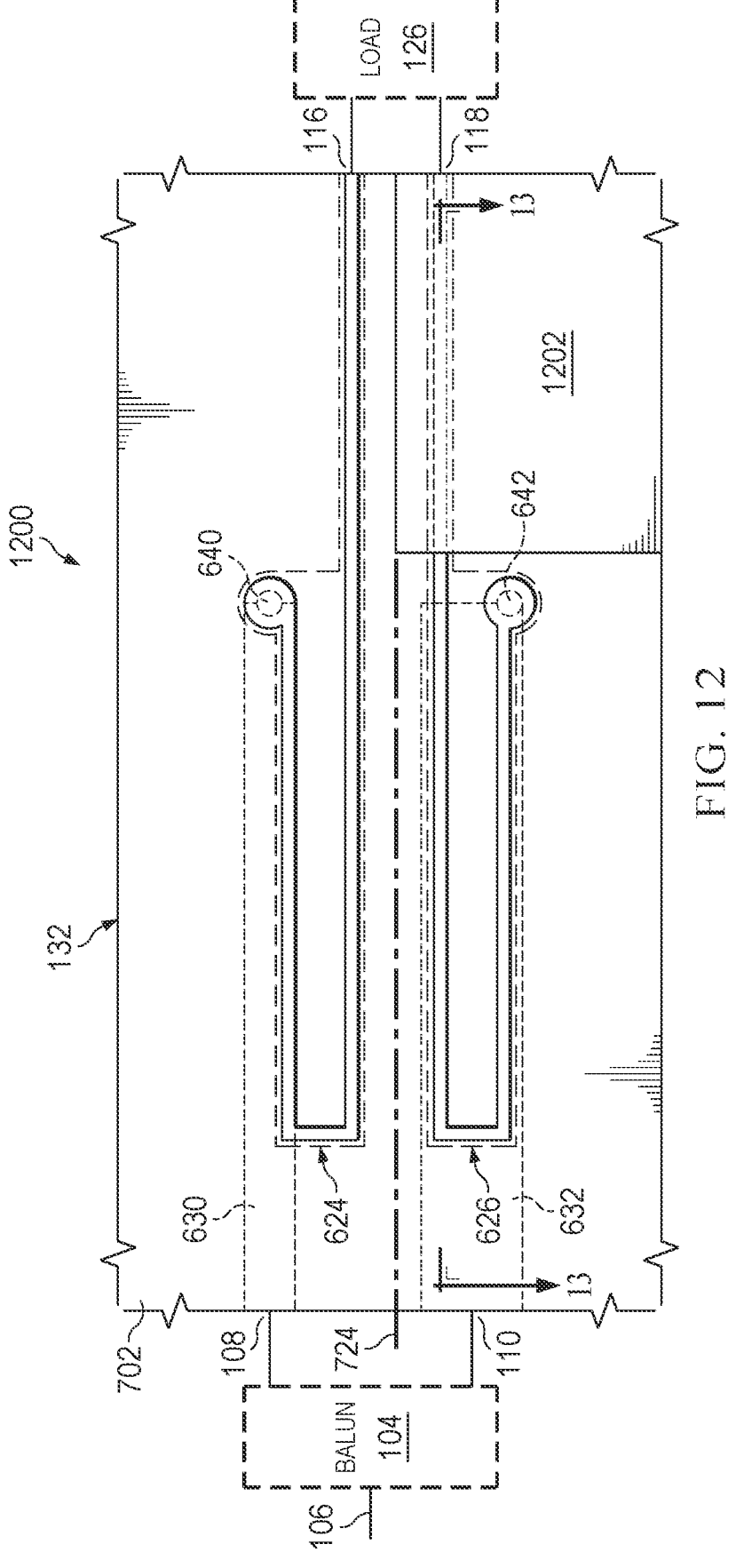
Figure 13:
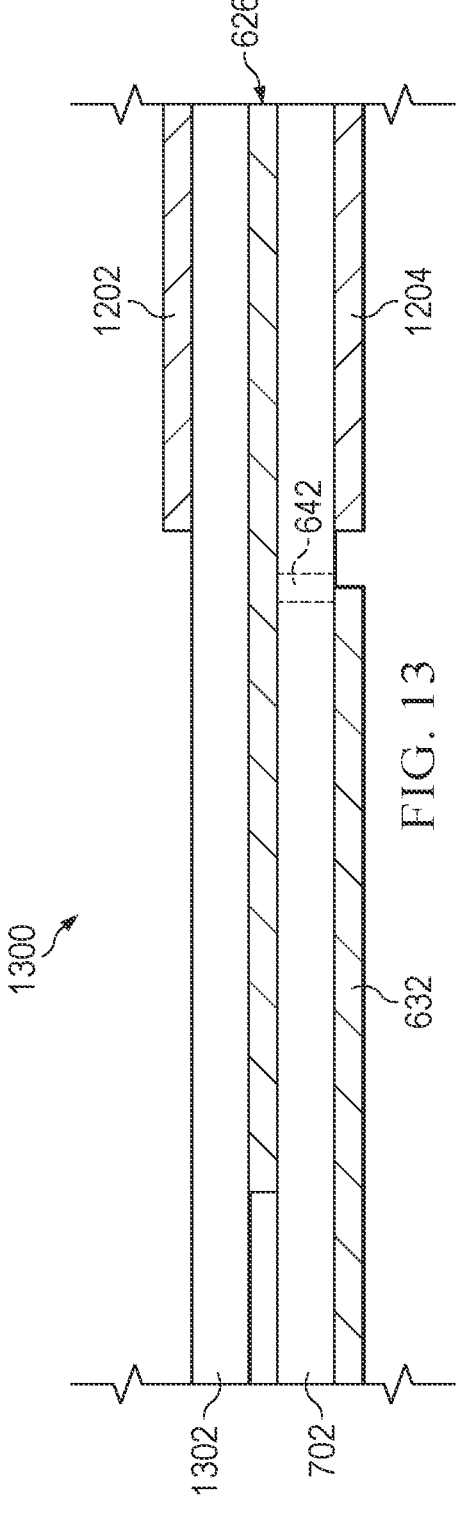

FIGS. 12 and 13 show a top view 1200 and a cross-sectional view 1300 of an integrated circuit with an asymmetric CM suppression circuit 132 that includes impedance loading by metal shields. Referring to FIGS. 12 and 13 concurrently, the CM suppression circuit 132 has metal shields 1202, 1204 that extend along the length of the second meandered conductor 626 between the fourth terminal 118 and the second interconnect 642. In some examples metal shield 1202 is disposed on a substrate layer 1302 that separates the metal shield 1202 from the second meandered conductor 626. In some examples the metal shield 1204 is disposed on the substrate 702. In other examples (not pictures) the metal shields 1202, 1204 can be disposed on other layers that overlie the second meandered conductor 626. Metal shields 1202, 1204 can increase the capacitance of the second meandered conductor 626 providing another asymmetric feature to tune the CM suppression circuit 132. As such, the amount by which metal shields 1202, 1204 overlap the second meandered conductor 626 is based on at least one of a phase imbalance or an amplitude imbalance between the first and second signals.

Figure 14:
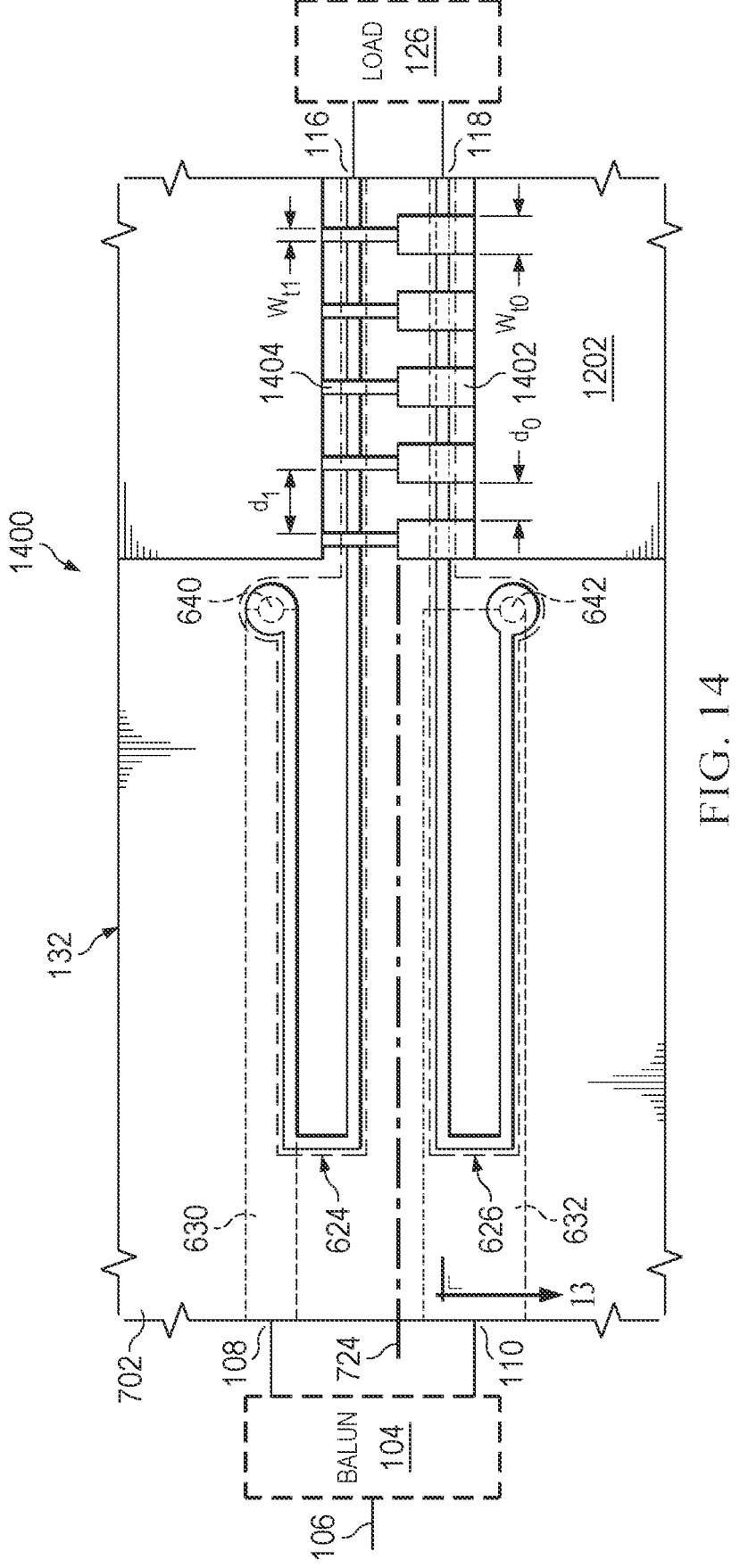

FIG. 14 shows a top view 1400 of an integrated circuit with an asymmetric CM suppression circuit 132 that includes asymmetric impedance loading by a metal shield with a metal teeth/rail structure. FIG. 14 shows alternative features relative to FIGS. 12-13 with respect to the metal shield 1202. Metal shield 1202 includes metal teeth that extend perpendicular to the first and second meandered conductors 624, 626. For example, metal shield 1202 can include a first plurality of adjacent metal teeth extensions 1402 that are positioned sideways along a portion of the second meandered conductor 626 between the fourth terminal 118 and the second interconnect 642. The first plurality of adjacent metal teeth extensions 1402 are separated from one another by a distance do and each of the first plurality of adjacent metal teeth extensions 1402 have a width $W_{t0}$. The first plurality of adjacent metal teeth extensions 1402 are connected to a corresponding second plurality of adjacent metal teeth extensions 1404.

The second plurality of adjacent metal teeth extensions 1404 are positioned sideways along a portion of the first meandered conductor 624 between the third terminal 116 and the first interconnect 640. The second plurality of adjacent metal teeth extensions 1404 are separated from one another by a distance di and each of the second plurality of adjacent metal teeth extensions 1404 have a width $W_{t1}$. The distance di is greater than the distance do and the width Wu is narrower than the width $W_{t0}$. The differences in distances and widths of the first and second plurality of adjacent metal teeth extensions 1402, 1404 an introduce different capacitances and inductances for the asymmetric impedance loading. As such, the metal shield 1202 provides asymmetric impedance loading of the first and second meandered conductors 624, 626. As such, the metal shield 1202 overlaps at least a part of the first meandered conductor 624 by a first overlap area, and the metal shield 1202 overlaps at least a part of the second meandered conductor 626 by a second overlap area. The first overlap area is different than the second overlap area where the difference between the first and second overlap areas are based on at least one of a phase imbalance or an amplitude imbalance between first and second signals.

Figure 15:
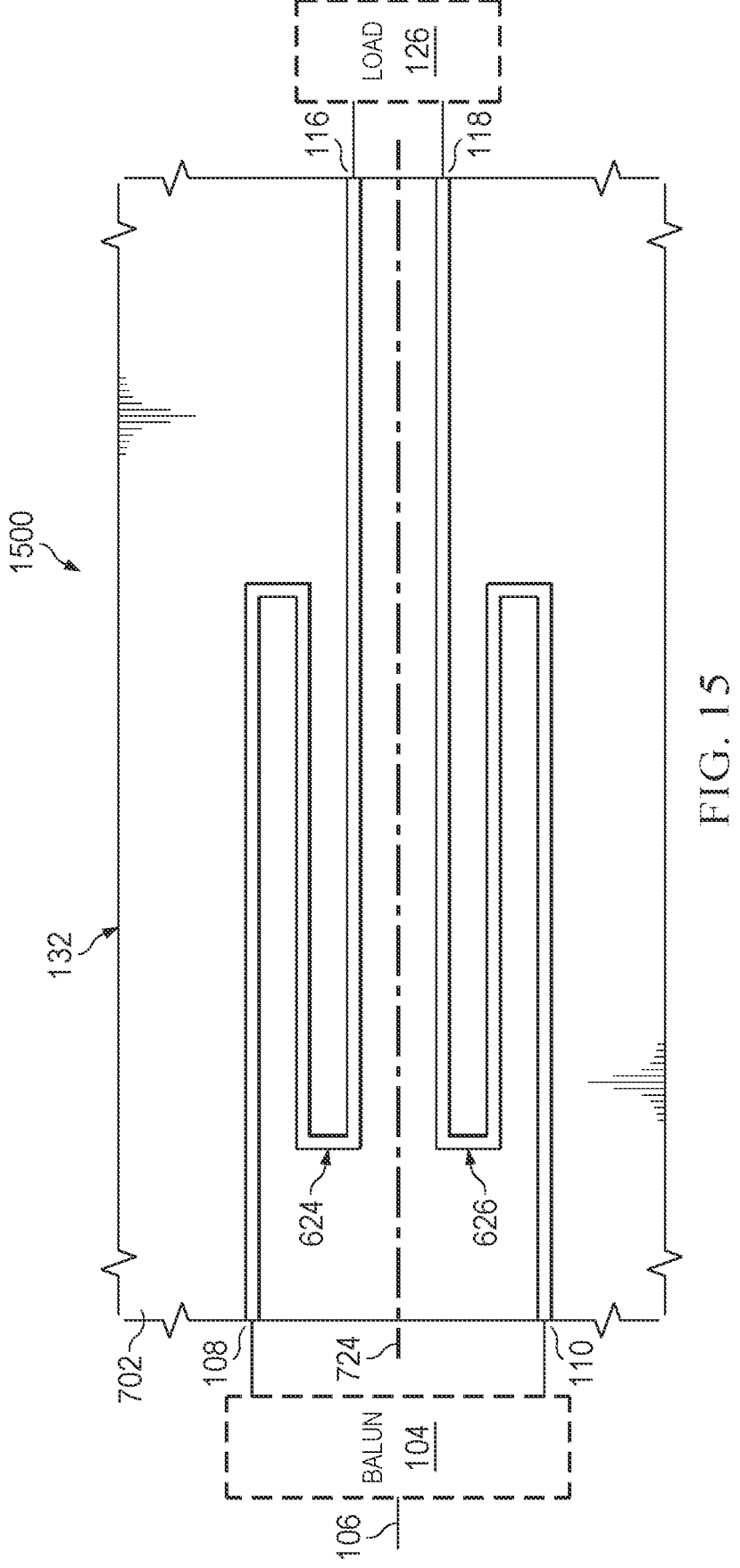

FIG. 15 shows a top view 1500 of an integrated circuit with a CM suppression circuit 132 with a first meandered conductor 624 and second meandered conductor 626 directly coupled between a balun 104 and a load 126. CM suppression circuit 132 differs from previous figures in that the CM suppression circuit 132 includes only the first and second meandered conductors 624, 626 and does not include the third and fourth conductors 630, 632. The first meandered conductor 624 is directly connected between the first terminal 108 and the third terminal 116. The second meandered conductor 626 is directly connected between the second terminal 110 and the fourth terminal 118. Each of the first and second meandered conductors have two meandered sections forming an "S" shape. In some embodiments (as shown) the first and second meandered conductors 624, 626 can have the same lengths and widths. In other embodiments (not shown) the first and second meandered conductors 624, 626 have different lengths and or different widths.

The above description of illustrated examples, implementations, aspects, etc., of the subject disclosure, including what is described in the Abstract, is not intended to be exhaustive or to limit the disclosed aspects to the precise forms disclosed. While specific examples, implementations, aspects, etc., are described herein for illustrative purposes, various modifications are possible that are considered within the scope of such examples, implementations, aspects, etc., as those skilled in the relevant art can recognize.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means +/−10 percent of the stated value, or, if the value is zero, a reasonable range of values around zero. Modifications are possible in the described examples, and other implementations are possible, within the scope of the claims.

What is claimed is:
1. An integrated circuit comprising:
a semiconductor die; and
a package substrate having opposite first and second surfaces, in which the first surface includes a first metal pad, the second surface includes a second metal pad and a third metal pad, the semiconductor die mounted on the second metal pad and the third metal pad by respective first and second metal interconnects, and the package substrate including:

a circuit having a single-ended terminal and a pair of differential terminals, the single-ended terminal coupled to the first metal pad; and a metal layer including a first meandered conductor and a second meandered conductor, in which the first meandered conductor is coupled between a first terminal of the pair of differential terminals and the second metal pad; and the second meandered conductor is coupled between a second terminal of the pair of differential terminals and the third metal pad.

2. The integrated circuit of claim 1, wherein dimensions of the first and second meandered conductors are based on at least one of: an operation frequency of the circuit, or an impedance resonant frequency between the second and third metal pads.

3. The integrated circuit of claim 2, wherein the circuit is configured to provide first and second signals having the operation frequency at the pair of differential terminals; and the dimensions of the first and second meandered conductors are based on at least one of a phase imbalance or an amplitude imbalance between the first and second signals.

4. The integrated circuit of claim 3, wherein the first and second meandered conductors are configured to provide different propagation distances for the respective first and second signals; and a difference between the propagation distances is based on at least one of a phase imbalance or an amplitude imbalance between the first and second signals.

5. The integrated circuit of claim 3, wherein the first meandered conductor has a first width, the second meandered conductor has a second width, and a difference between the first and second widths is based on at least one of a phase imbalance or an amplitude imbalance between the first and second signals.

6. The integrated circuit of claim 1, wherein:

the package substrate includes a first metal layer and a second metal layer;

the first meandered conductor and the second meandered conductor are in the first metal layer; and the second metal layer includes a third conductor and a fourth conductor, the third conductor coupled between the first terminal and the second metal pad, and the fourth conductor is coupled between the second terminal and the third metal pad.

7. The integrated circuit of claim 6, wherein dimensions of the third and fourth conductors are based on an operation frequency of the circuit.

8. The integrated circuit of claim 7, wherein the circuit is configured to provide first and second signals having the operation frequency at the pair of differential terminals; and wherein the dimensions of the third and fourth conductors are based on at least one of a phase imbalance or an amplitude imbalance between the first and second signals.

9. The integrated circuit of claim 7, wherein:

the circuit is configured to provide first and second signals having the operation frequency at the pair of differential terminals;

the first meandered conductor overlaps at least a part of the third conductor by a first overlap area;

the second meandered conductor overlaps at least a part of the fourth conductor by a second overlap area; and a difference between the first and second overlap areas is based on at least one of a phase imbalance or an amplitude imbalance between the first and second signals.

10. The integrated circuit of claim 8, wherein the integrated circuit further comprises:

a metal shield overlapping at least a part of the first meandered conductor by a first overlap area;

the metal shield overlapping at least a part of the second meandered conductor by a second overlap area; and a difference between the first and second overlap areas is based on at least one of a phase imbalance or an amplitude imbalance between the first and second signals.

11. The integrated circuit of claim 1, where the circuit is formed on two or more metal layers of the package substrate.

12. The integrated circuit of claim 1, where the circuit includes a balun.

13. The integrated circuit of claim 12, where:

a first side of the balun is on a first metal layer of the package substrate; and a second side of the balun is on a second metal layer of the package substrate.

14. The integrated circuit of claim 13, where the first side of the balun and the second side of the balun at least partially overlap.

15. The integrated circuit of claim 13, where the first meandered conductor and the second meandered conductor are on a same metal layer as the first side of the balun or the second side of the balun.

16. The integrated circuit of claim 1, where the third first metal pad and the first and second and third metal pads are on opposite sides of the package substrate.

17. The integrated circuit of claim 10, where the metal shield includes a first plurality of metal teeth extensions and a second plurality of metal teeth extensions.

* * * * *